(12) United States Patent
Patel et al.

(10) Patent No.: US 6,800,210 B2
(45) Date of Patent: Oct. 5, 2004

(54) METHOD FOR MAKING A MICROMECHANICAL DEVICE BY REMOVING A SACRIFICIAL LAYER WITH MULTIPLE SEQUENTIAL ETCHANTS

(75) Inventors: Satyadev R. Patel, Elk Grove, CA (US); Andrew G. Huibers, Mountain View, CA (US); Gregory P. Schaadt, Santa Clara, CA (US); Peter J. Heureux, Felton, CA (US)

(73) Assignee: Reflectivity, Inc., Sunnyvale, CA (US)

( * ) Notice: Subject to any disclaimer, the term of this patent is extended or adjusted under 35 U.S.C. 154(b) by 70 days.

(21) Appl. No.: 10/154,150

(22) Filed: May 22, 2002

(65) Prior Publication Data

US 2002/0197761 A1 Dec. 26, 2002

Related U.S. Application Data

(60) Provisional application No. 60/293,092, filed on May 22, 2001.

(51) Int. Cl.$^7$ ............................................. H01L 21/306
(52) U.S. Cl. ............................... 216/2; 216/58; 216/79; 438/719; 438/734; 438/706
(58) Field of Search ............................. 216/2, 17, 57, 216/79; 438/719, 733, 734

(56) References Cited

U.S. PATENT DOCUMENTS

| | | | |
|---|---|---|---|
| 4,354,897 A | * 10/1982 | Nakajima | ................... 438/704 |
| 5,683,591 A | * 11/1997 | Offenberg | ................... 216/2 |
| 5,716,495 A | 2/1998 | Butterbaugh et al. | |
| 6,020,272 A | * 2/2000 | Fleming | ................... 438/734 |
| 6,046,840 A | 4/2000 | Huibers | |
| 6,124,211 A | 9/2000 | Butterbaugh et al. | |
| 6,221,784 B1 | 4/2001 | Schmidt et al. | |
| 6,290,864 B1 | 9/2001 | Patel et al. | |
| 6,372,655 B2 | 4/2002 | Khan et al. | |

\* cited by examiner

Primary Examiner—Nadine G. Norton
Assistant Examiner—Shamim Ahmed
(74) Attorney, Agent, or Firm—Gregory R. Muir

(57) ABSTRACT

An etching method, such as for forming a micromechanical device, is disclosed. One embodiment of the method is for releasing a micromechanical structure, comprising, providing a substrate; providing a sacrificial layer directly or indirectly on the substrate; providing one or more micromechanical structural layers on the sacrificial layer; performing a first etch to remove a portion of the sacrificial layer, the first etch comprising providing an etchant gas and energizing the etchant gas so as to allow the etchant gas to physically, or chemically and physically, remove the portion of the sacrificial layer; performing a second etch to remove additional sacrificial material in the sacrificial layer, the second etch comprising providing a gas that chemically but not physically etches the additional sacrificial material. Another embodiment of the method is for etching a silicon material on or within a substrate, comprising: performing a first etch to remove a portion of the silicon, the first etch comprising providing an etchant gas and energizing the etchant gas so as to allow the etchant gas to physically, or chemically and physically, remove the portion of silicon; performing a second etch to remove additional silicon, the second etch comprising providing an etchant gas that chemically but not physically etches the additional silicon.

100 Claims, 12 Drawing Sheets

METHOD FOR MAKING A MICROMECHANICAL DEVICE BY REMOVING A SACRIFICIAL LAYER WITH MULTIPLE SEQUENTIAL ETCHANTS

CROSS-REFERENCE TO RELATED CASES

This application claims priority from a U.S. provisional patent application Ser. No. 60/293,092 filed on May 22, 2001.

BACKGROUND

A wide variety of micro-electromechanical devices (MEMS) are known, including accelerometers, DC relay and RF switches, optical cross connects and optical switches, microlenses, reflectors and beam splitters, filters, oscillators and antenna system components, variable capacitors and inductors, switched banks of filters, resonant comb-drives and resonant beams, and micromirror arrays for direct view and projection displays. There are a wide variety of methods for forming MEMS devices, including a) forming micromechanical structures monolithically on the same substrate as actuation or detection circuitry, b) forming the micromechanical structures on a separate substrate and transferring the formed structures to a circuit substrate, c) forming circuitry on one substrate and forming micromechanical elements on another substrate and bonding the substrates side by side or in a flip-chip type arrangement, or d) forming micromechanical structures without any circuitry. Regardless of the actual method used, at some point in the manufacturing process for making MEMS devices, a sacrificial layer is generally removed in order to release the micromechanical structure. The released structure is then able to be actively actuated or moved, such as pivoting or rotation of a micromirror for a projection display or optical switch, or movement during sensing, such as an accelerometer in an automobile airbag system.

SUMMARY OF THE INVENTION

In its most simple form, the invention is directed to etching a material where a first etch removes a portion of the material and fully or partially physically removes the material, and where a subsequent etch removes additional material and removes the material chemically but not physically. The material can be a semiconductor material such as silicon, and the areas removed can be of any dimensions such as an elongated trench, a well or other area limited in size, or even an entire area across a substrate. The result of the first and second etches can also result in an undercut such as for microfluidic channels or for a thermal sensor, or for simply removing material in an IC process.

In another embodiment, the invention is directed to releasing a micromechanical structure, comprising: providing a substrate; providing a sacrificial layer directly or indirectly on the substrate; providing one or more micromechanical structural layers on the sacrificial layer; performing a first etch to remove a portion of the sacrificial layer, the first etch comprising providing an etchant and energizing the etchant so as to allow the etchant to physically, or chemically and physically, remove the portion of the sacrificial layer; and performing a second etch to remove additional sacrificial material in the sacrificial layer, the second etch comprising providing a second ethant that chemically but not physically etches the additional sacrificial material.

Another embodiment of the method is for etching a material on or within a substrate, comprising: performing a first etch to remove a portion of the material, the first etch comprising providing an etchant and energizing the etchant so as to allow the etchant to physically, or chemically and physically, remove the portion of the material; and performing a second etch to remove additional silicon, the second etch comprising providing an etchant that chemically but not physically etches the additional material.

Also disclosed is an apparatus that comprises an etching chamber; connected to the etching chamber, a first source of etchant capable of etching a target material at least partially physically; and connected to the etching chamber, a second source of etchant different from the first source of etchant and capable of etching the target material chemically but not physically.

DETAILED DESCRIPTION

Micromechanical Structure Fabrication:

Processes for microfabricating a MEMS device such as a movable micromirror and mirror array are disclosed in U.S. Pat. Nos. 5,835,256 and 6,046,840 both to Huibers, the subject matter of each being incorporated herein by reference. A similar process for forming MEMS movable elements (e.g. mirrors) on a wafer substrate (e.g. a light transmissive substrate or a substrate comprising CMOS or other circuitry) is illustrated in FIGS. 1 to 4. By "light transmissive", it is meant that the material will be transmissive to light at least in operation of the device (The material could temporarily have a light blocking layer on it to improve the ability to handle the substrate during manufacture, or a partial light blocking layer for decreasing light scatter during use. Regardless, a portion of the substrate, for visible light applications, is preferably transmissive to visible light during use so that light can pass into the device, be reflected by the mirrors, and pass back out of the device. Of course, not all embodiments will use a light transmissive substrate). By "wafer" it is meant any substrate on which multiple microstructures or microstructure arrays are to be formed and which allows for being divided into dies, each die having one or more microstructures thereon. Though not in every situation, often each die is one device or product to be packaged and sold separately. Forming multiple "products" or dies on a larger substrate or wafer allows for lower and faster manufacturing costs as compared to forming each die separately. Of course the wafers can be any size or shape, though it is preferred that the wafers be the conventional round or substantially round wafers (e.g. 4", 6", 8" or 12" in diameter) so as to allow for manufacture in a standard foundry.

Figure 1A:
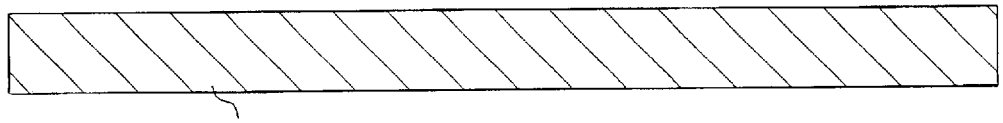
FIGS. 1A to 1E illustrate one method for forming micromirrors.

FIGS. 1A to 1D show a manufacturing process for a micromechanical mirror structure. As can be seen in FIG. 1A, a substrate such as glass (e.g. Corning 1737F), quartz, Pyrex™, sapphire, (or silicon alone or with circuitry thereon) etc. is provided. The cross section of FIGS. 1A–D is taken along line 1—1 of FIG. 2. An optional block layer on the glass surface (not shown) can be provided to block light (incident through the light transmissive substrate during use) from reflecting off of the hinge and potentially causing diffraction and lowering the contrast ratio (if the substrate is transparent).

Figure 1B:
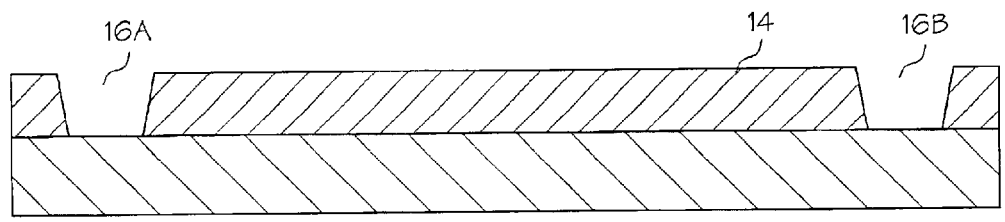

As can be seen in FIG. 1B, a sacrificial layer 14, such as amorphous silicon, is deposited. The thickness of the sacrificial layer can be wide ranging depending upon the movable element/mirror size and desired tilt angle, though a thickness of from 500 Å to 50,000 Å, preferably around 5000 Å is preferred. Alternatively the sacrificial layer could be polysilicon, silicon nitride, silicon dioxide, polyimide or other organic material, etc. depending upon the materials selected for the structural layers. A lithography step followed by a sacrificial layer etch forms holes 16a,b in the sacrificial silicon, which can be any suitable size, though preferably having a diameter of from 0.1 to 1.5 um, more preferably around 0.7+/−0.25 um. The etching is performed down to the glass/quartz substrate or down to the block layer if present. Preferably if the glass/quartz layer is etched, it is in an amount less than 2000 Å.

Figure 1C:
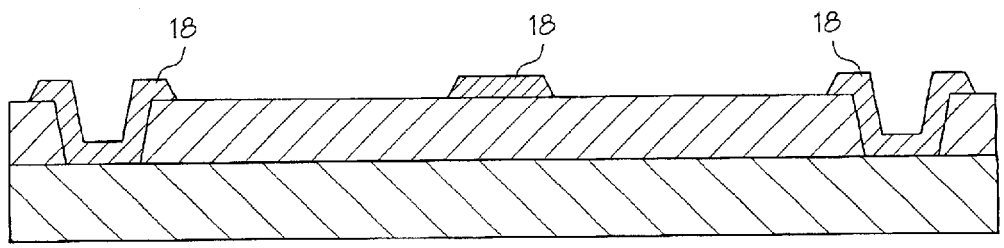

At this point, as can be seen in FIG. 1C, a first layer 18 is deposited by chemical vapor deposition. Preferably the material is silicon nitride or silicon oxide deposited by any suitable method such as sputtering, LPCVD or PECVD, however other materials such as polysilicon, silicon carbide or an organic compound could be deposited at this point (of course the sacrificial layer and at least the etchant of the second etch—to be described below—should be adapted to the material used). The thickness of this first layer can vary depending upon the movable element size and desired amount of stiffness of the element, however in one embodiment the layer has a thickness of from 100 to 3200 Å, more preferably around 1100 Å. The first layer undergoes lithography and etching so as to form holes (0.5 to 1 um in diameter) for posts for holding the MEMS structure on the substrate.

Figure 1D:
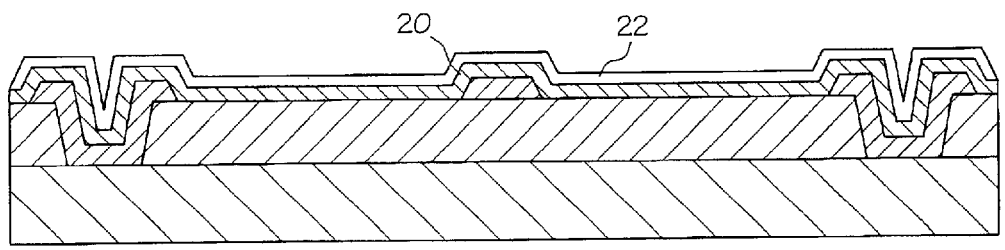
Figure 1E:
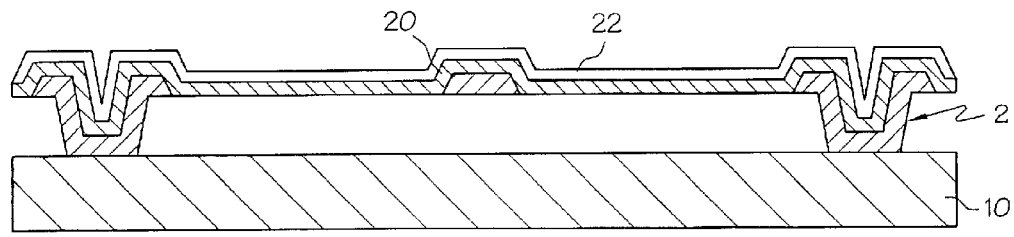
Figure 2:
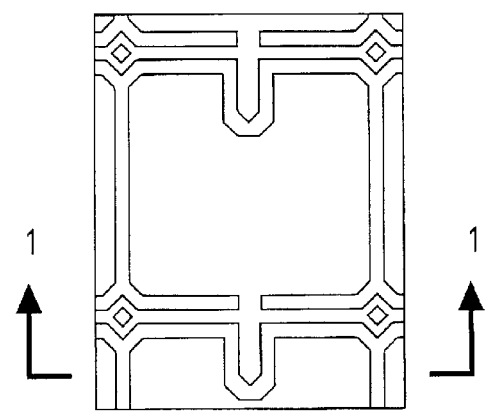
FIG. 2 is a top view of a micromirror showing line 1—1 for taking the cross section for FIGS. 1A to 1E.
Figure 3A:
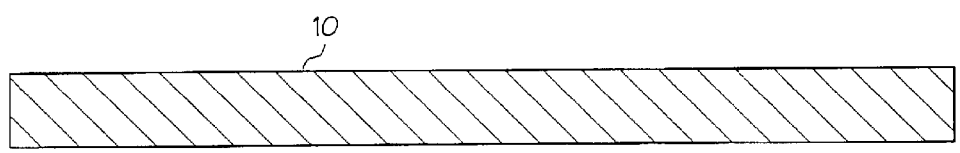
FIGS. 3A to 3E illustrate the same method as in FIGS. 1A to 1D but taken along a different cross section.
Figure 3B:
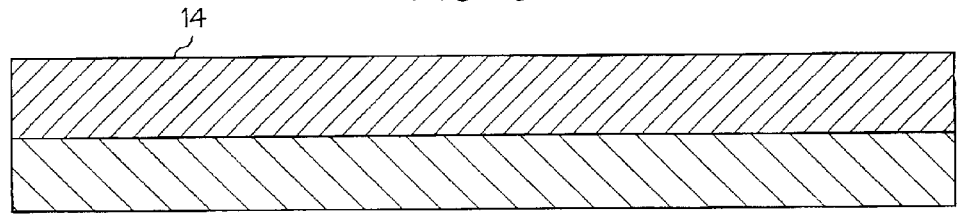
Figure 3C:
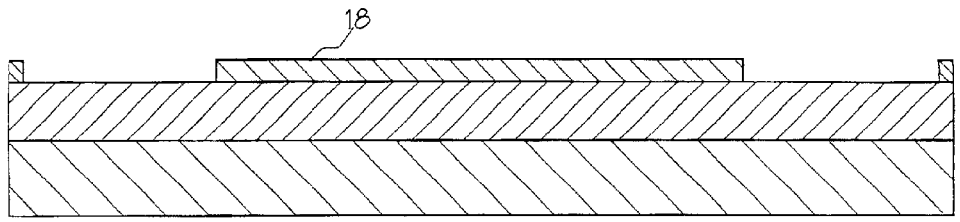
Figure 3D:
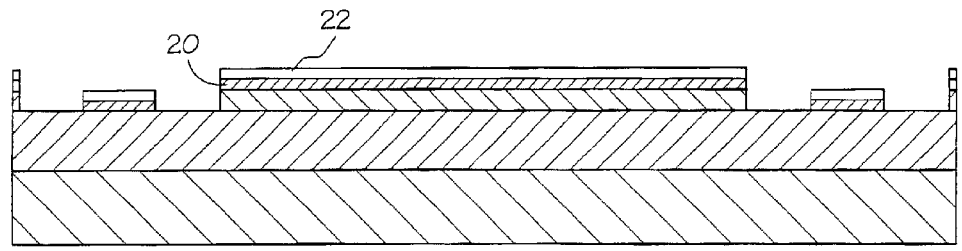
Figure 3E:
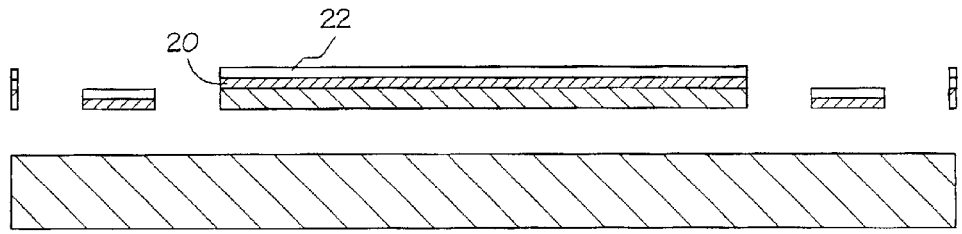
Figure 4:
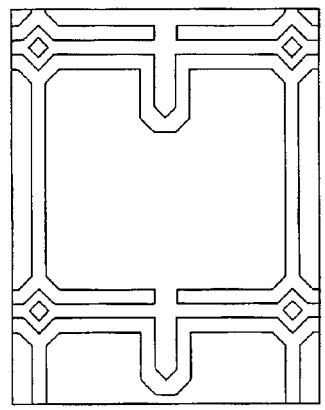
FIG. 4 is a top view of a mirror showing line 3—3 for taking the cross section for FIGS. 3A to 3E.

A second layer 20 (the "hinge" layer) is deposited as can be seen in FIG. 1D. By "hinge layer" it is meant the layer that defines that portion of the device that flexes to allow movement of the device. The hinge layer can be disposed only for defining the hinge, or for defining the hinge and other areas such as the mirror. In any case, it is preferred that the first layer is removed in hinge areas prior to depositing the hinge material (second layer). The material for the second (hinge) layer can be the same (e.g. silicon nitride) as the first layer or different (silicon oxide, silicon carbide, polysilicon, etc.) and can be deposited by any suitable method such as sputtering or chemical vapor deposition as for the first layer. The thickness of the second/hinge layer can be greater or less than the first, depending upon the stiffness of the movable element, the flexibility of the hinge desired, the material used, etc. In one embodiment the second layer has a thickness of from 50 Å to 2100 Å, and preferably around 500 Å. In another embodiment, the first layer is deposited by PECVD and the second layer by LPCVD.

As also seen in FIG. 1D, a reflective and conductive layer 22 is deposited. The reflective/conductive material can be gold, aluminum or other metal, or an alloy of more than one metal though it is preferably aluminum deposited by PVD. The thickness of the metal layer can be from 50 to 2000 Å, preferably around 500 Å. It is also possible to deposit separate reflective and conductive layers. An optional metal passivation layer (not shown) can be added, e.g. a 10 to 1100 ÅA TiN or TiON layer deposited by PECVD. Then, photoresist patterning on the metal layer is followed by etching through the metal layer with a suitable metal etchant. In the case of an aluminum layer, a chlorine (or bromine) chemistry can be used (e.g. a plasma/RIE etch with $Cl_2$ and/or $BCl_3$ (or Cl2, CCl4, Br2, CBr4, etc.) with an optional preferably inert diluent such as Ar and/or He).

In the embodiment illustrated in FIGS. 1A to 1D, both the first and second layers are deposited in the area defining the movable element, whereas the second layer, in the absence of the first layer, is deposited in the area of the hinge. It is also possible to use more than two layers to produce a laminate movable element, which can be desirable particularly when the size of the movable element is increased such as for switching light beams in an optical switch. A plurality of layers could be provided in place of single layer 18 in FIG. 1C, and a plurality of layers could be provided in place of layer 20 and in place of layer 22. Or, layers 20 and 22 could be a single layer, e.g. a pure metal layer or a metal alloy layer or a layer that is a mixture of e.g. a dielectric or semiconductor and a metal. Some materials for such layer or layers that could comprise alloys of metals and dielectrics or compounds of metals and nitrogen, oxygen or carbon (particularly the transition metals) are disclosed in U.S. provisional patent application No. 60/228,007, the subject matter of which is incorporated herein by reference.

Whatever the specific combination, it is desirable that the first/reinforcing layer(s) is provided and patterned (at least in the hinge area) prior to depositing and patterning the hinge material and metal. In one embodiment, the reinforcing layer is removed in the area of the hinge, followed by depositing the hinge layer and patterning both reinforcing and hinge layer together. This joint patterning of the reinforcing layer and hinge layer can be done with the same etchant (e.g. if the two layers are of the same material) or consecutively with different etchants. The reinforcing and hinge layers can be etched with a chlorine chemistry or a fluorine chemistry where the etchant is a perfluorocarbon or hydrofluorocarbon (or SF6) that is energized so as to selectively etch the reinforcing and/or hinge layers both chemically and physically (e.g. a plasma/RIE etch with $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$, all possibly with one or more optional inert diluents). Of course, if different materials are used for the reinforcing layer and the hinge layer, then a different etchant can be employed for etching each layer. Alternatively, the reflective layer can be deposited before the first (reinforcing) and/or second (hinge) layer. Whether deposited prior to the hinge material or prior to both the hinge material and the reinforcing material, it is preferable that the metal be patterned (e.g. removed in the hinge area) prior to depositing and patterning the hinge material.

FIGS. 3A to 3D illustrate the same process taken along a different cross section (cross section 3—3 in FIG. 4) and show the sacrificial layer 14 deposited on the light transmissive substrate 10, followed by layers 18, 20 and the metal layer 22. The cross sections in FIGS. 1A to 1D and 3A to 3D are taken along substantially square mirrors in FIGS. 2 and 4 respectively.

It should also be noted that materials and method mentioned above are examples only, as many other method and materials could be used. For example, the Sandia SUMMiT process (using polysilicon for structural layers) or the Cronos MUMPS process (also polysilicon for structural layers) could be used in the present invention. Also, a MOSIS process (AMI ABN-1.5 um CMOS process) could be adapted for the present invention, as could a MUSiC process (using polycrystalline SiC for the structural layers) as disclosed, for example, in Mehregany et al., Thin Solid Films, v. 355–356, pp. 518–524, 1999. Also, though PVD and CVD are referred to above, other thin film deposition methods could be used for depositing the layers, including spin-on, anodization, oxidation, electroplating and evaporation.

After forming the microstructures as in FIGS. 1 to 4 on the first wafer, it is preferable to remove the sacrificial layer so as to release the microstructures (in this case micromirrors). The release is described in more detail hereinbelow. This release can be performed at the die level, though it is preferred to perform the release at the wafer level. FIGS. 1E and 3E show the microstructures in their released state. As can be seen in FIG. 1E, posts 2 hold the released microstructure on substrate 10.

Figure 5:
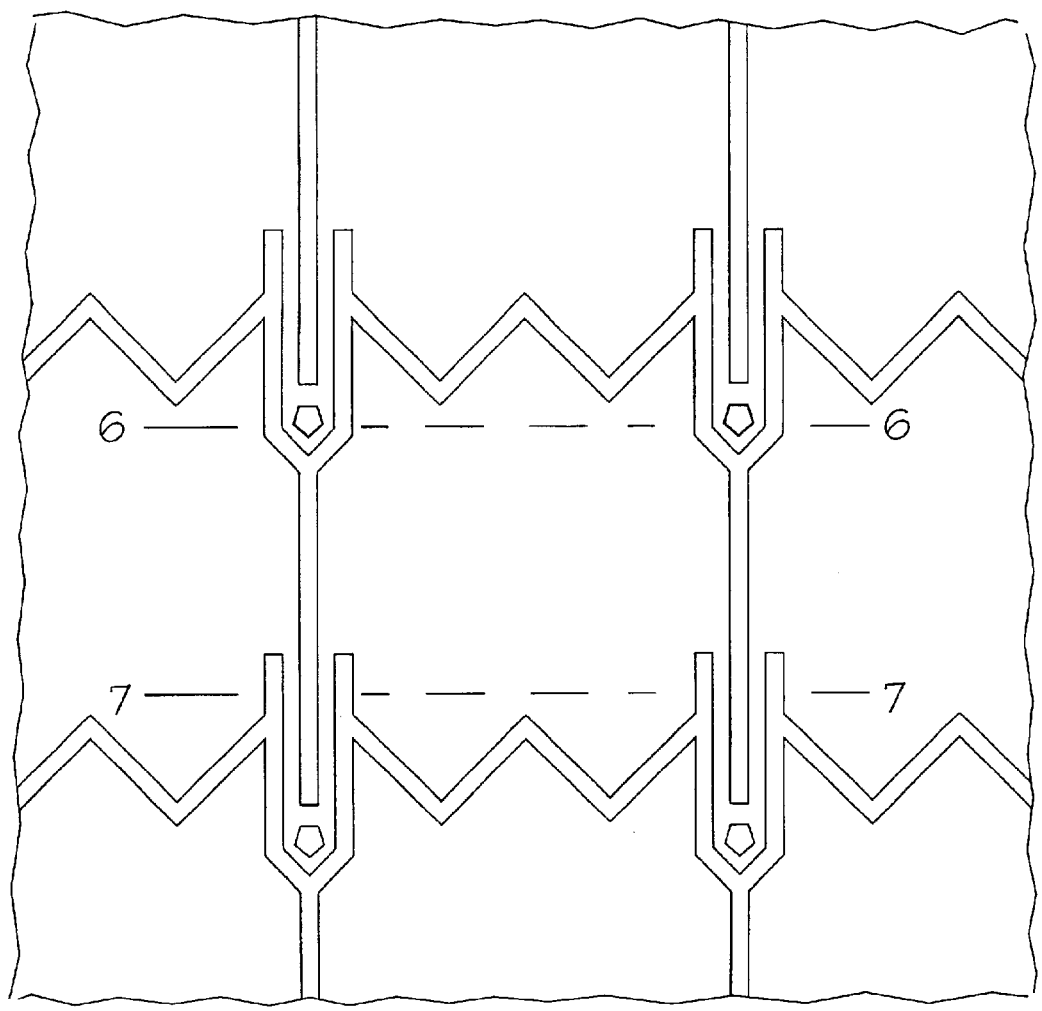
FIG. 5 is an illustration of a second embodiment of a micromirror in the present invention.

An alternate embodiment to that illustrated in FIGS. 1-4, is illustrated in FIGS. 5 to 7. As can be seen in FIG. 5, the mirror formed is not square. The micromirrors of the present invention need not be square but can have other shapes that may decrease diffraction and increase the contrast ratio, depending upon the position of the light source. Such mirrors are disclosed in U.S. provisional patent application No. 60/229,246 to Ilkov et al. filed Aug. 30, 2000, and U.S. patent application Ser. No. 09/732,445 to Ilkov et al. filed Dec. 7, 2000, the subject matter of each being incorporated herein by reference. Also, the mirror hinges can be flexure hinges as illustrated in the above-mentioned applications and as shown in FIG. 5 of the present application.

Figure 6A:
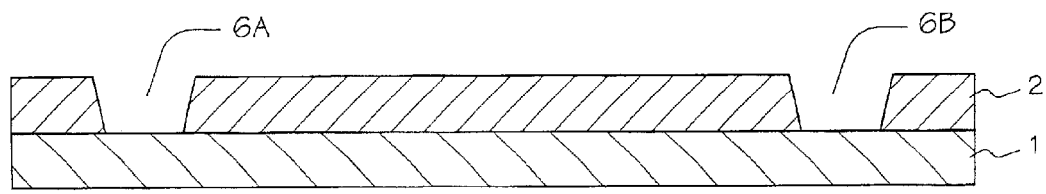
FIGS. 6A to 6C are cross sectional views of a method of making the micromirrors of FIG. 5, taken along line 6—6 in FIG. 5.
Figure 6B:
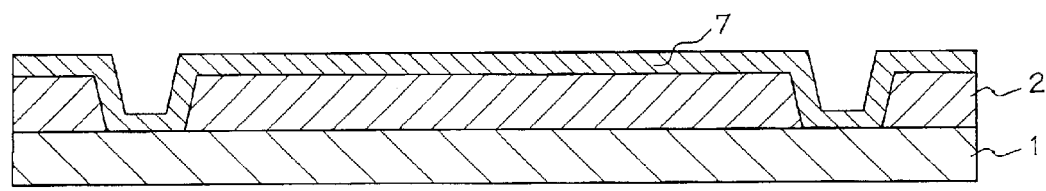
Figure 6C:
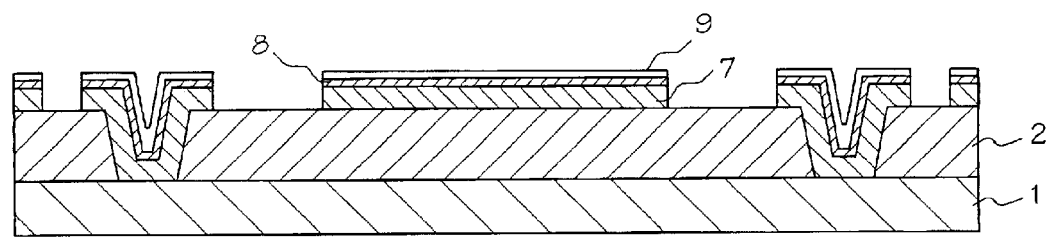

FIGS. 6A to 6C are cross sections taken along line 6—6 of FIG. 5. As can be seen in FIG. 6A, a substrate 1 is provided. A sacrificial layer 2 is deposited thereon and patterned so as to form holes 6A, 6B. The sacrificial material can be any suitable sacrificial material known in the art, such as amorphous silicon, silicon nitride, silicon oxynitride, silicon dioxide, PSG, amorphous silicon, etc. On layer 2 is deposited a micromechanical structural layer 7 (FIG. 6B) of a material different than that of the sacrificial layer (e.g. polysilicon if the sacrificial layer is silicon dioxide, silicon nitride if the sacrificial layer is amorphous silicon or polyimide, etc.). As can be seen in FIG. 6C, an additional structural layer 8 is deposited (after removing part of layer 7 in the hinge areas—not evident in this cross section), followed by depositing a reflective layer 9 (e.g. a metal such as Al, Ag, Au etc.). Layers 2, 7, 8 and 9 can be deposited by any known methods depending upon the material (spin-on for an organic material such as polyimide, chemical vapor deposition or sputtering for silicon or silicon compounds, sputtering for metal, etc.) and/or as disclosed herein with respect to the other figures. Finally, as illustrated in FIG. 6C, layers 7 to 9 are patterned by depositing and patterning photoresist followed by etching with a suitable etchant selected for the material(s) being etched (e.g. chlorine chemistry for a metal layer, hydrocarbon or fluorocarbon (or SF6) plasma for silicon or silicon compound layers, etc.). Not shown is the final removal of the sacrificial layer 2, discussed further herein below.

Figure 7A:
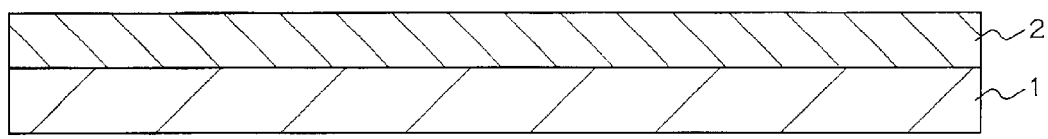
FIGS. 7A to 7C are cross sectional views of the method illustrated in FIGS. 6A to 6C, taken along line 7—7 in FIG. 5.
Figure 7B:
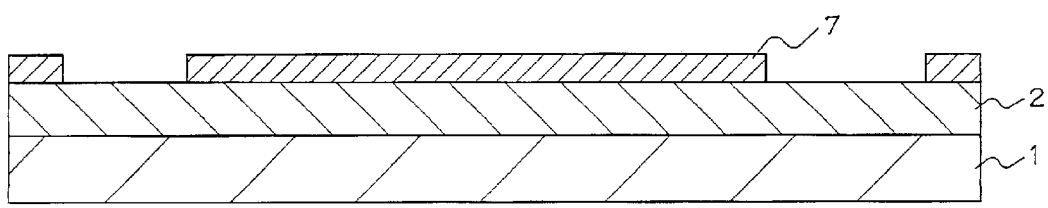
Figure 7C:
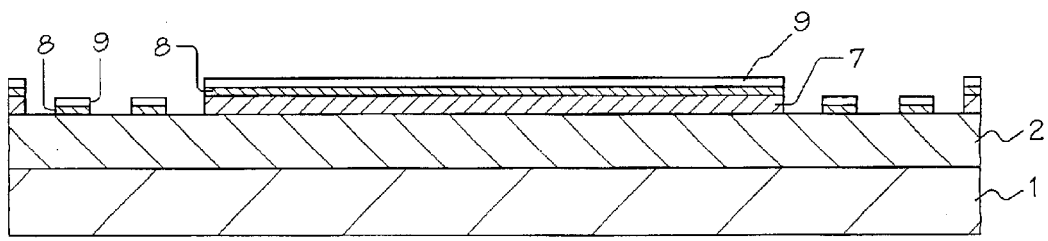

FIGS. 7A to 7C illustrate the same process as in FIGS. 6A to 6C, but are cross sectional views taken along line 7—7 of FIG. 5. As can be seen in FIG. 7A, the sacrificial layer 2 is deposited on substrate 1, followed by, in FIG. 7B, depositing layer 7. After deposition of layer 7, portions are removed (see gaps in layer 7 in FIG. 7B). This can be performed with a chlorine, chlorine compound, hydrocarbon, fluorocarbon or other known plasma etch selected based on the composition of layer 7. Then, as can be seen in FIG. 7C, layers 8 and 9 are deposited over all areas (not shown) followed by patterning to form hinges in the gaps in layer 7 and a corresponding reflective movable mirror element. The hinges, therefore, are made of layers 8 and 9 (e.g. a silicon or silicon compound layer and a metal layer) and the mirror area is formed of layers 7 to 9. Of course there are many variations to the above, such as putting the metal layer down first, forming the hinges or the entire device from a silicon compound-metal alloy (such as in application No. 60/228,007 mentioned above), or using a single silicon or silicon compound layer and a single metal layer.

Circuitry:

In the present invention, the circuitry can be formed together on the same substrate as the microstructures, such as in U.S. Pat. Nos. 5,061,049, 5,527,744, and 5,872,046. If the microstructures are not formed monolithically on the same wafer as the circuitry, then a second substrate can be provided having circuitry thereon (or, circuitry could be provided on both the first wafer and the replacement substrate if desired). If the microstructures are micromirrors, then it may be preferable to form circuitry and electrodes on a second wafer substrate with at least one electrode electrostatically controlling one pixel (one micromirror on the first wafer portion of the die) of the microdisplay. The voltage on each electrode on the surface of the backplane determines whether its corresponding microdisplay pixel is optically 'on' or 'off,' forming a visible image on the microdisplay. Details of the backplane and methods for producing a pulse-width-modulated grayscale or color image are disclosed in U.S. patent application Ser. No. 09/564,069 to Richards, the subject matter of which is incorporated herein by reference.

The display pixels themselves, in a preferred embodiment, are binary, always either fully 'on' or fully 'off,' and so the backplane design is purely digital. Though the micromirrors could be operated in analog mode, no analog capability is necessary. For ease of system design, the backplane's I/O and control logic preferably run at a voltage compatible with standard logic levels, e.g. 5V or 3.3V. To maximize the voltage available to drive the pixels, the backplane's array circuitry may run from a separate supply, preferably at a higher voltage.

One embodiment of the backplane can be fabricated in a foundry 5V logic process. The mirror electrodes can run at 0–5V or as high above 5V as reliability allows. The backplane could also be fabricated in a higher-voltage process such as a foundry Flash memory process using that process's high-voltage devices. The backplane could also be constructed in a high-voltage process with larger-geometry transistors capable of operating at 12V or more. A higher voltage backplane can produce an electrode voltage swing significantly higher than the 5–7V that the lower voltage backplane provides, and thus actuate the pixels more robustly.

In digital mode, it is possible to set each electrode to either state (on/off), and have that state persist until the state of the electrode is written again. A RAM-like structure, with one bit per pixel is one architecture that accomplishes this. One example is an SRAM-based pixel cell. Alternate well-known storage elements such as latches or DRAM (pass transistor plus capacitor) are also possible. If a dynamic storage element (e.g. a DRAM-like cell) is used, it is desirable that it be shielded from incident light that might otherwise cause leakage.

The perception of a grayscale or full-color image will be produced by modulating pixels rapidly on and off, for example according to the method in the above-mentioned U.S. patent application Ser. No. 09/564,069 to Richards. In order to support this, it is preferable that the backplane allows the array to be written in random-access fashion, though finer granularity than a row-at-a-time is generally not necessary.

It is desirable to minimize power consumption, primarily for thermal reasons. Decreasing electrical power dissipation will increase the optical/thermal power budget, allowing the microdisplay to tolerate the heat of more powerful lamps. Also, depending upon the way the microdisplay is assembled (wafer-to-wafer join+offset saw), it may be preferable for all I/O pads to be on one side of the die. To minimize the cost of the finished device it is desirable to minimize pin count. For example, multiplexing row address or other infrequently-used control signals onto the data bus can eliminate separate pins for these functions with a negligible throughput penalty (a few percent, e.g. one clock cycle for address information per row of data is acceptable). A data bus, a clock, and a small number of control signals (5 or less) are preferred.

In use, the die can be illuminated with a 200 W or more arc lamp. The thermal and photocarrier effects of this may result in special layout efforts to make the metal layers as 'opaque' as possible over the active circuitry to reflect incident optical energy and minimize photocarrier and thermal effects. An on-chip PN diode could be included for measuring the temperature of the die.

In one embodiment the resolution is XGA, 1024×768 pixels, though other resolutions are possible. A pixel pitch of from 5 to 24 um is preferred (e.g. 14 um). The size of the electrode array itself is determined by the pixel pitch and resolution. A 14 um XGA device's pixel array will therefore be 14.336×10.752 mm.

Figure 8:
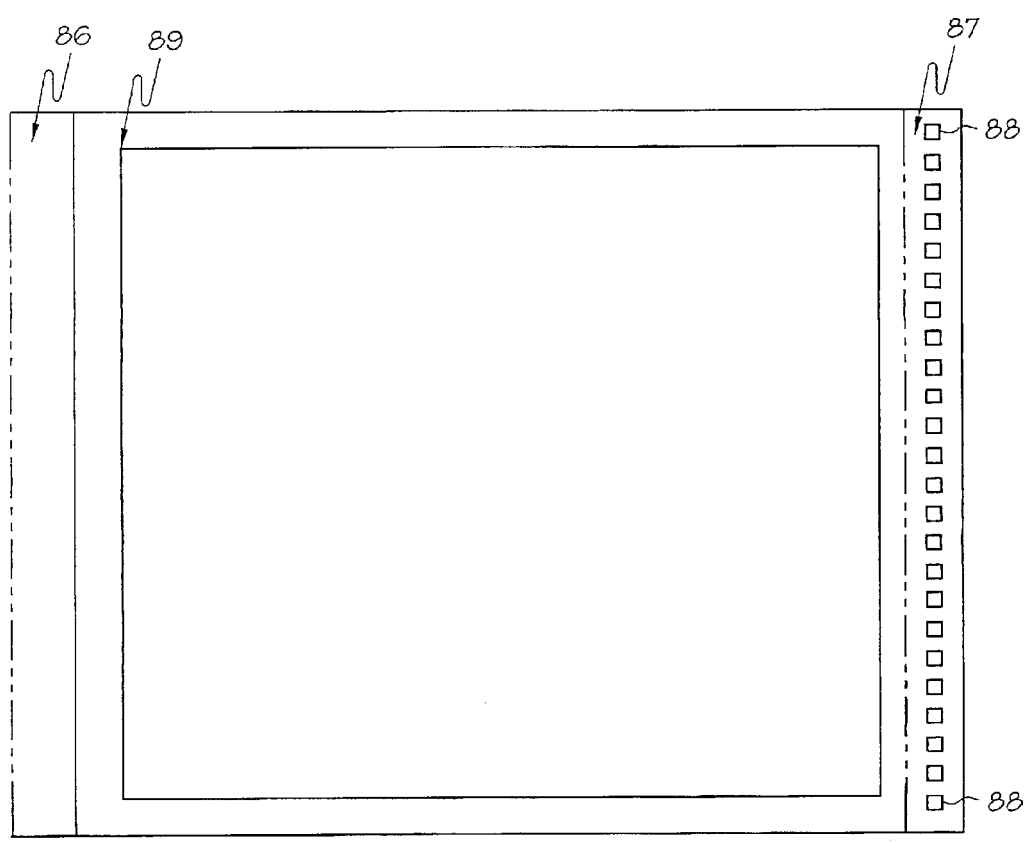
FIG. 8 is an illustration of the I/O pads and Si backplane for the embodiment of the invention using separate substrates.

As can be seen in FIG. 8, the I/O pads (88) can be placed along the right edge of the die, as the die is viewed with pixel (0,0) (89 in FIG. 5) at the top left corner. Putting the pads on the 'short' (left/right) edge (87) of the die is preferable due to the slightly reduced die size. The choice of whether the I/O should go on the left vs. right edge of the die is of little importance since the display controller ASIC may support mirroring the displayed image in the horizontal axis, the vertical axis, or both. If it is desired to orient the display with the I/O on the left edge, the image may simply be rotated 180 degrees by the external display controller. The electrode voltage during operation is, in the low state 0V and in the high state preferably from 5 to 7 V (or 12V or higher in the higher voltage design). Of course other voltages are possible, though lower actuation voltages are preferred. In one embodiment the electrodes are metal squares, though other geometries are possible. Standard CMOS passivation stackup over the electrodes can be provided.

Assembly:

After depositing and patterning the various micromechanical layers, the substrate itself, or a deposited sacrificial material, is removed in order to release the micromechanical structures. Removal of substrate of deposited material can also be simply for undercutting (e.g. for a thermal sensor) or for forming wells or trenches (e.g in an integrated circuit process). In any case, the removal/etching of material is preferably performed immediately prior to bonding the just-etched substrate to another substrate (e.g. a) a circuit substrate as disclosed hereinabove, b) a permanent silicon, glass or other substrate such as when the micromechanical structures are formed monolithically on the same substrate as actuation, detection or other circuitry, or c) a removable "sacrificial" substrate such as disclosed in U.S. patent application No. 60/276,222 to Patel et al. filed Mar. 15, 2001. Regardless of the type and purpose of the second substrate to be attached, any known substrate or specifically wafer bonding process could be used, including epoxy bonding (disclosed further below), anodic bonding, fusion bonding, metal thermocompression bonding, etc.). In one embodiment of the invention, the substrate with (preferably released) micromechanical structures, or undercut structures, is bonded to the second substrate with the application of epoxy. Before or after such substrate bonding, an optional anti-stiction treatment or other passivation treatment, or treatment for improving epoxy bond strength, can be applied. If an anti-stiction treatment is performed, in a preferred embodiment the treatment is a self assembled monolayer or lubricant. The anti-stiction layer is preferably formed by placing the device in a liquid or gas silane, preferably an alkyl silane, e.g. a chlorosilane known in the art. Of course, many different silanes and other materials are known in the art for their ability to reduce surface contact forces and provide anti-stiction for MEMS structures.

The release of the micromechanical structures in the present invention (e.g. micromirrors)—or simple etching—is a multi-step process. A first etch is performed that has relatively low selectivity (e.g. less than 200:1, preferably less than 100:1 and more preferably less than 35:1 or even 10:1). A second etch follows has higher selectivity (e.g. greater than 100:1, preferably greater than 200:1 and more preferably greater than 500:1 or even 1000:1). The first etch is preferably a gas etch where the etchant is preferably a fluoride etchant, more preferably an energized fluoride gas. The energized fluoride gas is energized with, for example, light (e.g. UV light), an electric field, or other fields or energy to energize the gas beyond its normal energy as a gas at a particular temperature, such as into a plasma state. This energizing of the gas of the invention gives it a physical component to its etching behavior, in addition to a chemical component. Specific examples for energizing the etchant of the first etch include using a pair of parallel plate electrodes disposed in a chamber with a gas, and applying electric power of high frequency to the electrodes so that gas discharging takes place to generate gas plasma. Besides reactive ion etching and plasma etching, there are EDR dry etching methods, ion beam etching methods and photo excited etching methods. The first etchant could also be a noble gas which is energized so as to cause a purely physical etch in the first etch (e.g. an Ar or Xe sputter etch). These methods for the first etch in the invention preferably accomplish the initial etch by causing an interaction physically (Ar sputter) or chemically and physically (plasma fluoride compound) between the energized gas and the material to be removed in making the MEMS device. The first etch, therefore, is preferably the result of at least energetic bombardment of the sacrificial material (e.g. by charged species such as positive ions, electrons or negative ions), and possibly additionally a chemical reaction between the etchant gas or gases (e.g. by radicals) and the sacrificial material, The first etch utilizes a halogen containing etchant gas that removes the silicon containing sacrificial material both chemically and physically and is preferably a fluorocarbon compound which has carbon and fluorine components (a perfluorocarbon), or carbon, fluorine and hydrogen components (a hydrocarbon). Chlorofluorocarbons and bromofluorocarbons (e.g. $C2F2Cl2$, $C3F4Cl2$, $CFCl$, $C3F2Cl2Br2$, $CF3Cl$, $C2F2Br2$, $CFBr$ and $CF2ClBr$) are also possibilities, though they are banned in most countries of the world. If the etchant gas is of the formula $C_xF_y$, it can be $C5F12$, $C3F6$, $C2F6$, $C3F8$, $C4F8$, $CF4$, $C2F4$, $CF2$, $C2F6$, $C4F10$, $C6F14$ or other etchant consisting of carbon and fluorine as is known in the art. If the etchant gas is a hydrocarbon of the formula $C_xF_yH_z$, it can be $C3HF6$, $C3H2F6$, $C3H3F5$, $CH2F2$, $C3HF7$ or other etchant consisting of carbon, fluorine and hydrogen as is known in the art. Or, the etchant of the first etch could be an oxygenated perfluorocarbon, such as $CF3OCHFCF3$ or $CF3CF2OCF2CHF2$. The first etch can alternatively utilize sulfur hexafluoride, or an energized interhalogen or a noble gas halide that etches the sacrificial material both chemically and physically (e.g. RIE/plasma $XeF2$, $IF5$, $BrCl3$, $BrF3$, $IF7$, $ClF3$, $ClF5$, $ICl$, $IBr$, etc.).

In one embodiment, the first etch gas is excited with multiple or single wavelengths in the ultraviolet region, preferably in the UV-C region, such as with synchrotron radiation, or preferably with a xenon flash lamp (200 nm and above), a photoionization lamp such as a Cathodeon photoionization lamp (112 nm to 250 nm), a vacuum ultra violet lamp such as a Cathodeon (Deuterium arc source) vacuum ultra violet lamp (112 nm up to 900 nm), or a McPherson Deuterium VUV (emissions continuous between 165 nm and 370 nm). Of course the spectrum or specific wavelength can be tailored to the etchant gas being used. For example, a single wavelength excimer laser could also be used, that has a wavelength that corresponds to an absorption wavelength of the etchant gas. For example, if the first etch uses $XeF2$, then an excimer laser emitting a wavelength of 157 nm could be used to photoionize the $XeF2$ gas. For example, a fluorine laser (e.g. a VUV 157 nm GAM laser, Lambda-Physik Novaline F1030–1000 Hz 157 nm fluorine laser, or a Cymer ELX-6500 1000 Hz 157 nm fluorine laser) that is scanned over the substrate surface or exposes the entire substrate or portions thereof (e.g. die portions) at the same time due to magnification with $CaF2$ optics (e.g. a catadioptric lens system)—with or without a mask to protect micromechanical structures-can be utilized. In the alternative, a plasma etching system, e.g. from MRC, Drytek or Applied Materials, could be used to energize the first etch gas.

One or more additional gases can be mixed with the aforementioned etchants for the first etch, including one or more of $O2$, an inert gas such as Xe or Ar, $N2$, $F2$, $H2$, $CO$, $N_xF_y$ (e.g. $NF3$), $Si_xF_y$ (e.g. $SiF4$) or an additional fluorocarbon (with or without a hydrogen component) as above. The exact mixture of gases for the first etch can be optimized for the sacrificial material as known in the art, though it is not necessary that the selectivity be optimized (rather that the primary fluoride containing gas and any additional gases be capable of etching silicon and/or silicon compounds when energized). Regardless of which gas or gases are used in the first energized etch, it is preferred that the first etch not proceed all the way through the thickness of the sacrificial layer. In most cases, the first etch should proceed through ¼ or less, or preferably ¹⁄₁₀ or less of the total thickness of the sacrificial layer. Also, it is preferred that the etch proceed for less than 20 minutes, and more preferably less than 10 minutes. The preferred etching depth is 500 angstroms or less and preferably less than 250 angstroms. Such limits on the first etch should result in substantially no undercutting (of etch material from under the micromechanical structural material).

The second etch utilizes an etchant gas capable of spontaneous chemical etching of the sacrificial material, preferably isotropic etching that chemically (and not physically) removes the sacrificial material. Such chemical etching and apparatus for performing such chemical etching are disclosed in U.S. patent application Ser. No. 09/427,841 to Pate et al. filed Oct. 26, 1999, and in U.S. patent application Ser. No. 09/649,569 to Patel at al. filed Aug. 28, 2000, the subject matter of each being incorporated herein by reference. Preferred etchants for the second etch are gas phase fluoride etchants that, except for the optional application of temperature, are not energized. Examples include HF gas, noble gas halides such as xenon difluoride, and interhalogens such as $IF5$, $BrCl3$, $BrF3$, $IF7$ and $ClF3$. The second etch may comprise additional gas components such as $N2$ or an inert gas (Ar, Xe, He, etc.). Though such gases can be used in the first etch, the difference is that in the first etch they are energized (e.g to a plasma state) to physically and chemically etch the sacrificial material, whereas in the second etch, except for optional heating, the gas is not energized and chemically etches the sacrificial material isotropically. In this way, the remaining sacrificial material is removed and the micromechanical structure is released. In one aspect of such an embodiment, $BrF3$ or $XeF2$ are provided in a plasma-etching chamber with diluent (e.g. $N2$ and He). A plasma etch for 1 to 90 minutes, depending upon the concentration of etchant used, is followed by a non-plasma chemical etch using the same interhalogen or noble gas halide.

In one embodiment, the first etch removes sacrificial material exposed between micromechanical elements to be released that are from ¼ to 5 um, preferably from ½ to 1 um spaced apart from each other, thus removing "strips" of sacrificial material having an effective width of e.g. from ½ to 1 um. The depth of sacrificial material removed in the first etch is from 10 to 100 angstroms and is less than ¹⁄₁₀th, preferably less than ¹⁄₂₀th of the total depth of sacrificial material to be removed by both the first and second etchants. The material removed between each microstructure and substrate has a length and width of from 10 to 1000 um (preferably from 25 to 100 um) and a depth of from 0.25 to 50 um (preferably from 1 to 10 um)—with in most cases the etching undercuts and releases structural layers having a surface area of from 100 to 2500 $um^2$.

Referring again to FIGS. 1–4, it can be seen that a metal layer (e.g. aluminum) in this embodiment is provided prior to performing the first and second etches. As such, in a preferred embodiment of the invention the first and second etches would minimally harm any metal (e.g. Al) provided as part of the microstructures or metallic interconnects, while at the same time being preferably relatively non-selective so as to remove residues such as photoresist, photoresist developer or remover/cleaner, as well as oxides of silicon, silicon, etc. An industry standard HF (gas or liquid) wash would not meet these preferred characteristics (higher Al damage, low Si etching, etc.).

The methods discussed generally above, can be implemented in a number of ways. For example, a glass wafer (such as a Corning 1737F, Eagle 2000, quartz or sapphie wafer) can be provided and coated with an opaque coating, such as a Cr, Ti, Al, TaN, polysilicon or TiN or other opaque coating at a thickness of 2000 angstroms (or more depending upon the material) on the backside of the wafer, in order to make the transparent substrate temporarily opaque for handling. Then, in accordance with FIGS. 1–4, after an optional adhesion layer is deposited (e.g. a material with dangling silicon bond such as $SiN_x$—or $SiO_x$, or a conductive material such as vitreous carbon or indium tin oxide) then a sacrificial material of hydrogenated amorphous silicon is deposited (gas=$SiH_4$ (200 sccm), 1500 sccm of Ar, power=100 W, pressure=3.5 T, temp=380C, electrode spacing=350 mil; or gas=150 sccm of $SiH_y$, 100 sccm of Ar, power=55 W, pressure=3 Torr, temp=380C, electrode spacing=350 mil; or gas=200 sccm $SiH_4$, 1500 sccm Ar, power=100 W, temp=300C, pressure=3.5 T; or other process points in between these settings) on the transparent wafer at a thickness of 5000 Angstroms in a plasma enhanced chemical vapor deposition system such as an Applied Materials P5000. Or, the sacrificial material could be deposited by LPCVD at 560C, along the lines set forth in U.S. Pat. No. 5,835,256 to Huibers et al., incorporated herein by reference. Or, the sacrificial material could be deposited by sputtering, or could be a non-silicon containing material such as an organic material (to be later removed by, e.g. plasma oxygen ash). The a-Si is patterned (photoresist and etched by a chlorine chemistry, e.g. $Cl_2$, $BCl_3$ and $N_2$), so as to form holes for attachment of the mirror to the glass substrate. A first layer of silicon nitride, for creating stiffness in the mirror and for connecting the mirror to the glass, is deposited by PECVD (RF power=150 W, pressure=3 Torr, temp=360C, electrode spacing=570 mils, gas=$N_2$/$SiH_4$/$NH_3$ (1500/25/10); or RF power=127 W, pressure=2.5 T, temp=380C, gas=$N_2$/$SiH_4$/$NH_3$ (1500/25/10 sccm), electrode spacing=550 mil, or other process parameters could be used, such as power at 175 W and pressure at 3.5 Torr) at a thickness of 900 Angstroms and is patterned (pressure=800 mT, RF power=100 to 200 W, electrode spacing=0.8 to 1.1 mm, gas=$CF_4$/$CHF_3$/Ar (60 or 70/40 to 70/600 to 800 sccm, He=0 to 200 sccm), so as to remove the silicon nitride in areas in which the mirror hinges will be formed. Next, a second layer of silicon nitride is deposited by PECVD (RF power=127 W, pressure=2.5 T, temp=380C, gas $N_2$/$SiH_4$/$NH_3$ (1500/25/10 sccm), electrode spacing=550 mil) at a thickness of 900 Angstroms. Then, Al is sputtered onto the second silicon nitride layer at a thickness of 500 Angstroms at a temp of from 140 to 180C, power=2000 W, Ar=135 sccm. Or, instead of Al, the material could be an aluminum alloy (Al-Si (1%), Al-Cu (0.5%) or AlSiCu or AlTi, as well as an implanted or target doped aluminum. The aluminum is patterned in the P5000 with a chlorine chemistry (pressure=40 mT, power=550 W, gas=$BCl_3$/$Cl_2$/$N_2$=50/15/30 sccm). Then, the SiN layers are etched (pressure=100 mT, power=460 W, gas=$CF_4$/$N_2$ (9/20 sccm), followed by ashing in a $H_2O$+$O_2$+$N_2$ chemistry in plasma. Next, the remaining structures are ACT cleaned (acetone+DI wafer solution) and spun dry. (this clean can also be done with EKC Technology's EKS265 photoresist residue remover or other solvent based cleaner) After resist coating the frontside of the wafer having the microstructures thereon, the backside TiN is etched in a $BCl_3$/$Cl_2$/$CF_4$ chemistry in plasma (or other metal etchant from CRC Handbook of Metal Etchants)—or polished or ground off using CMP, or removed with acid vapor such as HF—followed by a second ACT clean (acetone+DI wafer solution) and a second spin dry. The wafer is singulated into individual die and each die is exposed to 300 W $CF_4$ plasma (pressure=150 Torr, 85 sccm for 60 seconds, followed by 300 sec etch in a mixture of He, $XeF_2$ and $N_2$ (etch pressure 158 mTorr). The etch is performed by providing the die in a chamber of $N_2$ at around 400 mTorr. A second area/chamber has therein 3.5 mTorr $XeF_2$ and 38.5 mTorr He. A barrier between the two areas/chambers is removed, resulting in the combined $XeF_2$, He and $N_2$ etching mixture.

Or, the transparent wafer (e.g. Corning 1737F) is coated with TiN at a thickness of 2000 angstroms on the backside of the glass wafer. Then, in accordance with FIGS. 1–4, without an adhesion layer, a sacrificial material of hydrogenated amorphous silicon is deposited (power=100 W, pressure=3.5 T, temp=300C, $SiH_4$=200 sccm, Ar=1500 sccm, or pressure=2.5 Torr, power=50 W, temp=360C, electrode spacing=350 mils, $SiH_4$ flow=200 sccm, Ar flow=2000 sccm) on a glass wafer at a thickness of 5300 Angstroms in an Applied Materials P5000. The a-Si is patterned (photoresist and etched by a chlorine chemistry, e.g. $Cl_2$, $BCl_3$ and $N_2$-50 W), so as to form holes for attachment of the mirror to the glass substrate. A first layer of silicon nitride, for creating stiffness in the mirror and for connecting the mirror to the glass, is deposited by PECVD (pressure=3 Torr, 125 W, 360C, gap=570, $SiH_4$=25 sccm, $NH_3$=10 sccm, $N_2$=1500 sccm) at a thickness of 900 Angstroms and is patterned ($CF_4$/$CHF_3$), so as to remove the silicon nitride in areas in which the mirror hinges will be formed. Next, a second layer of silicon nitride is deposited by PECVD (same conditions as first layer) at a thickness of 900 Angstroms. Then, Al is sputtered (150C) onto the second silicon nitride layer at a thickness of 500 Angstroms. The aluminum is patterned in the P5000 with a chlorine chemistry ($BCl_3$, $Cl_2$, Ar). Then, the SiN layers are etched ($CHF_3$, $CF_4$), followed by ashing in a Hitachi barrel asher ($O_2$, $CH_3OH$ at 250C). Next, the remaining structures are cleaned with EKC Technology's EKS265 photoresist residue remover. After resist coating the frontside of the wafer having the microstructures thereon, the backside TiN is etched in a $SF_6$/Ar plasma, followed by a second clean and a second spin dry.

After depositing the sacrificial and structural layers on a wafer substrate, the wafer is singulated and each die then is placed in a Drytek parallel plate RF plasma reactor. 100 sccm of $CF_4$ and 30 sccm of $O_2$ flow to the plasma chamber, which is operated at about 200 mtorr for 80 seconds. Then, the die is etched for 300 seconds at 143 mTorr etch pressure (combined $XeF_2$, He and $N_2$). The etch is performed by providing the die in a chamber of $N_2$ at around 400 mTorr. A second area/chamber has therein 5.5 mTorr $XeF_2$ and 20 mTorr He. A barrier between the two areas/chambers is removed, resulting in the combined $XeF_2$, He and $N_2$ etching mixture. The above could also be accomplished in a parallel plate plasma etcher with power at 300 W $CF_4$ (150 Torr, 85 sccm) for 120 seconds. Additional features of the second (chemical, non-plasma) etch are disclosed in U.S. patent application Ser. No. 09/427,841 to Patel et al. filed Oct. 26, 1999, and U.S. patent application Ser. No. 09/649,569 to Patel et al. filed Aug. 28, 2000, the subject matter of each being incorporated herein by reference.

Figure 9A:
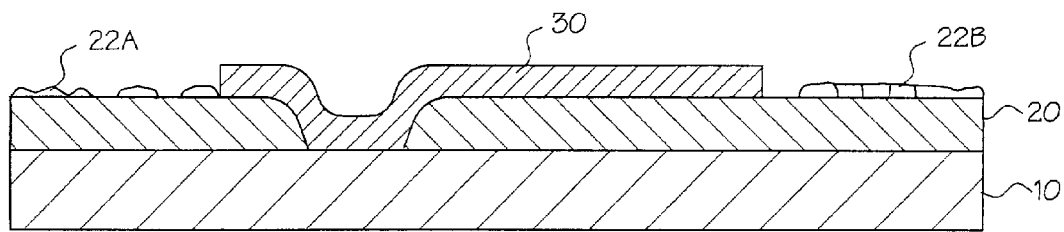
FIGS. 9A to 9D are cross sectional views illustrating the dual etching steps in the method of the present invention.
Figure 9B:
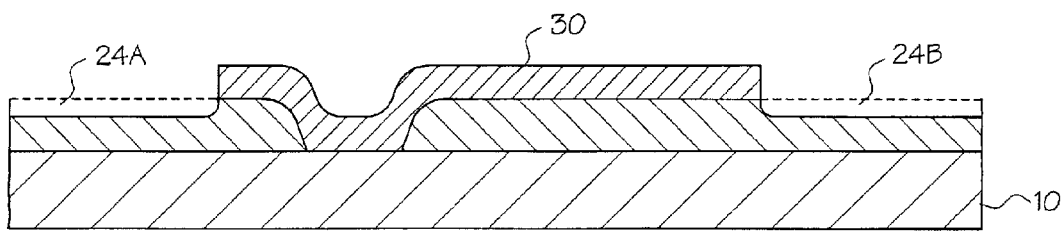
Figure 9C:
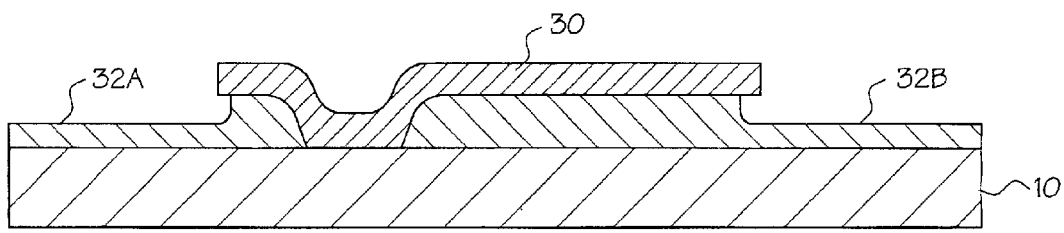
Figure 9D:
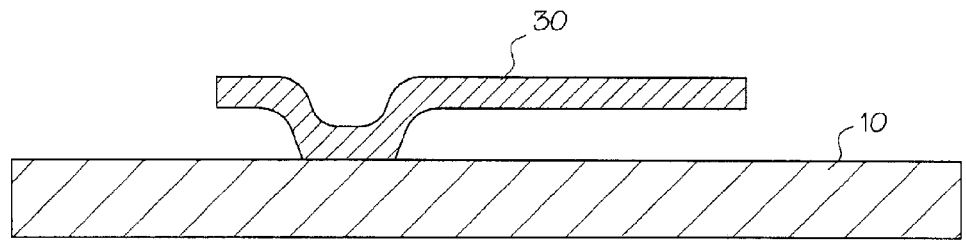
Figure 10:
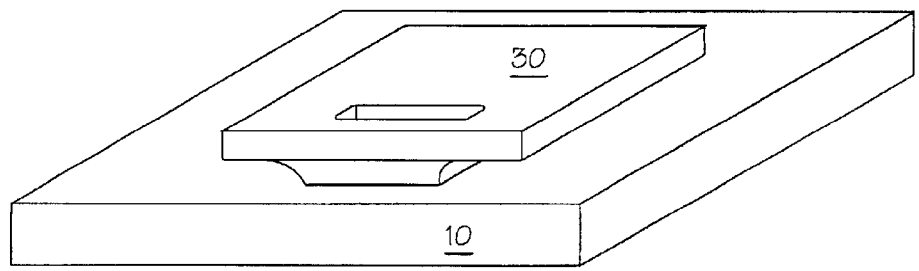
FIG. 10 is an isometric view of a released microstructure.
Figure 11:
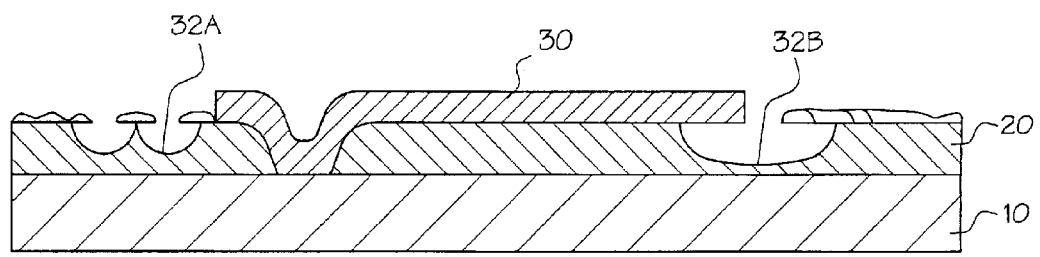
FIG. 11 is a cross sectional view of a second etch performed without the first etch.

As can further be seen in FIGS. 9A to D, a substrate 10 (silicon or glass) has a sacrificial silicon or silicon compound layer 20 disposed thereon. One or more structural layers 30 are provided (and patterned) on the sacrificial layer 20. Residue 22a and 22b from prior processing steps for forming the micromechanical structures prior to release are disposed on sacrificial layer 20. As can be seen in FIG. 9B, after a first fully physical or physical/chemical etch, a first portion of the sacrificial layer 20 (along with residue 22a and 22b) is removed. Then, as can be seen in FIG. 9C, the remainder of sacrificial layer 20 is in the process of being removed by a purely chemical etch, which ultimately results in releasing the micromechanical structure 30 as can be seen in FIG. 9D and FIG. 10. As can be seen in FIG. 11, if the first etch is not performed prior to the second etch, then uneven etching results as illustrated by lines 32a and 32b.

Figure 12:
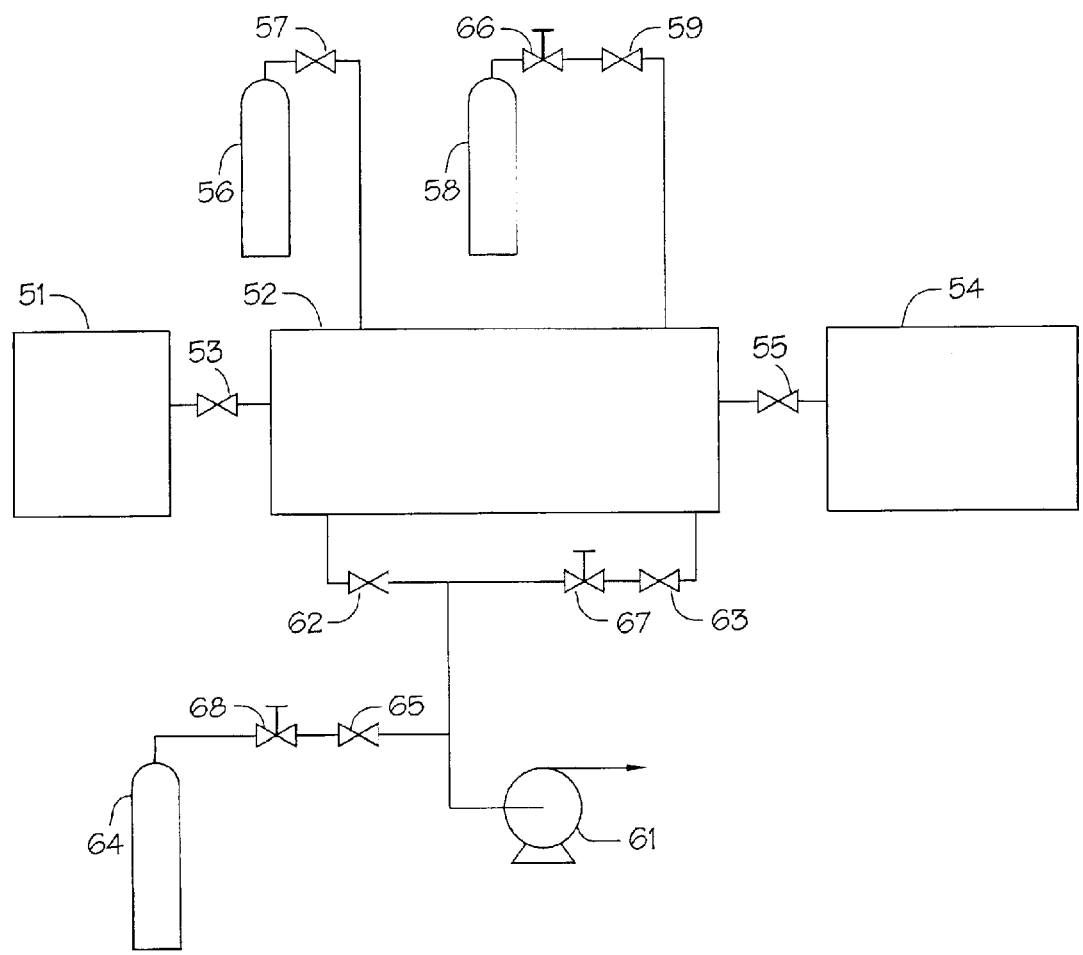
FIG. 12 is a view of one embodiment of an apparatus for performing etching in the present invention.
Figure 13:
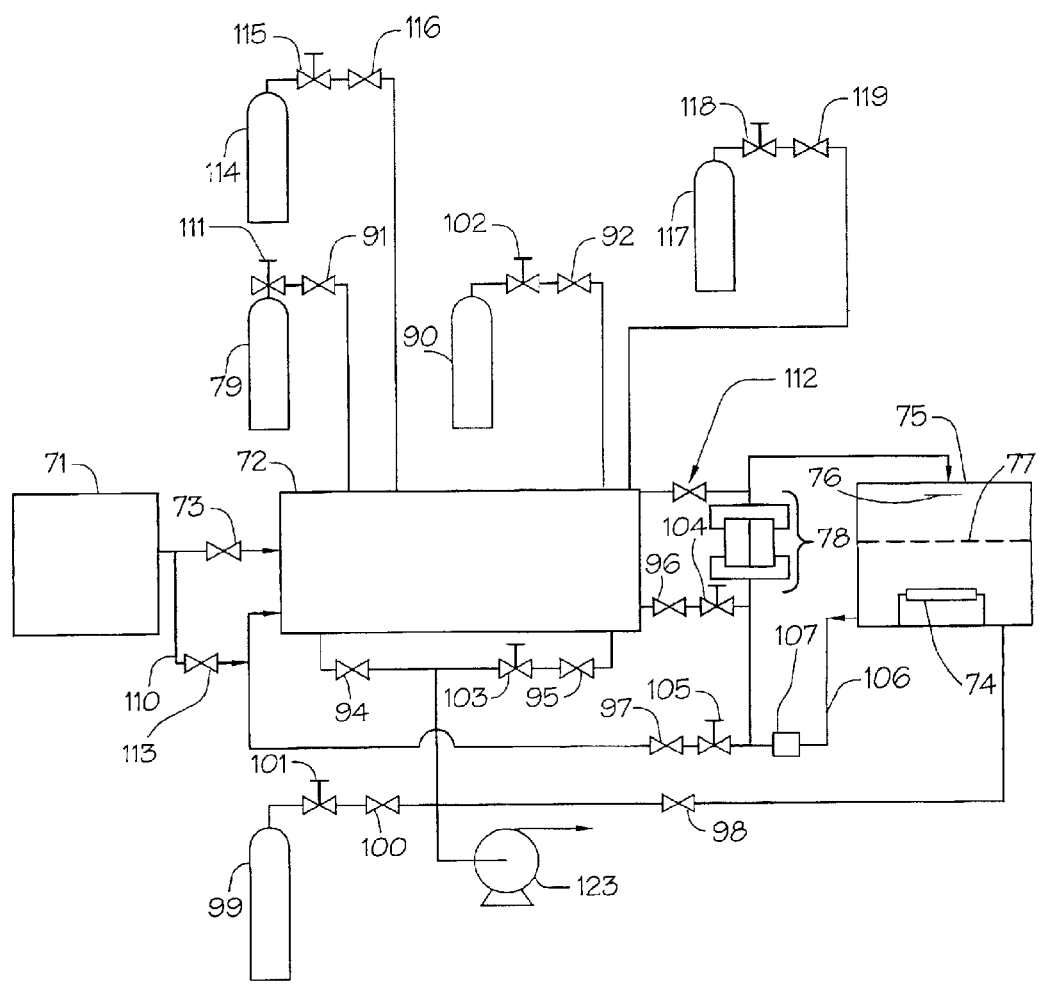
FIG. 13 is a view of another embodiment of the apparatus of the present invention.
Figure 14:
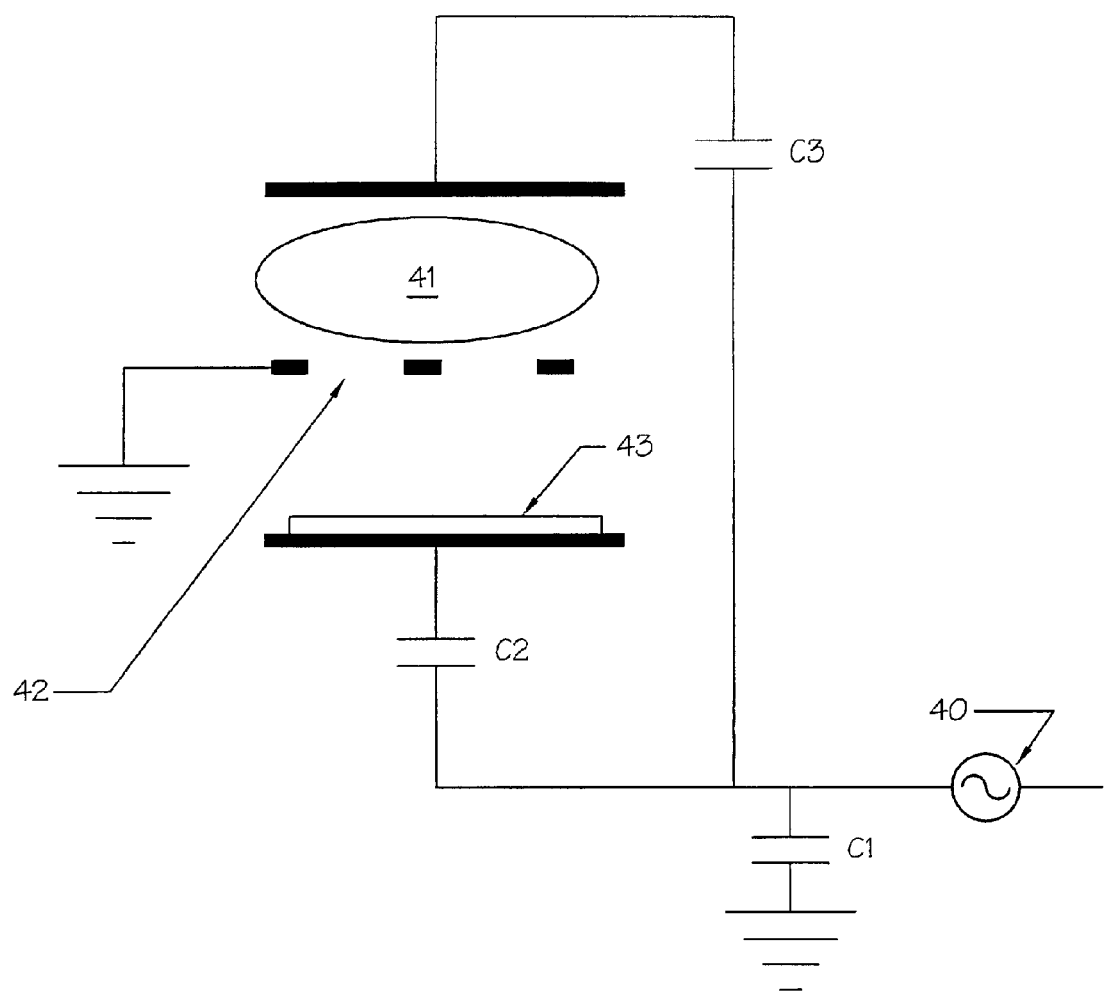
FIG. 14 is an illustration of further details of the etching chamber for one embodiment of the invention.

The apparatus for performing the etching of the present invention can be seen in FIGS. 12 to 14. As can be seen in FIG. 12, an apparatus is provided that includes a source chamber 51 (containing, for example, xenon difluoride crystals for the second etch—the crystals maintained at a temperature of 28.5° C. at which temperature the sublimation pressure of the crystals is 5–11 mbar (4–8 torr)), an expansion chamber 52 having a volumetric capacity of 29 cubic inches (0.46 liter) to receive xenon difluoride gas from the source chamber 51, with a shutoff valve 53 joining these two chambers, an etch chamber 54 having a volumetric capacity of 12 cubic inches (0.18 liter) to contain the sample microstructure to be etched, the etch chamber 54 fed by the expansion chamber 52 through a further shutoff valve 55. Also included in the apparatus is a first gas source 56 communicating with the expansion chamber 52 through a further shutoff valve 57, a second gas source 58 communicating with the expansion chamber through a separate shutoff valve 59, a vacuum pump 61 and associated shutoff valves 62, 63 to control the evacuation of the chambers, a third gas source 64 serving as a pump ballast with an associated shutoff valve 65 to prevent backstreaming from the pump 61, and manually operated needle valves 66, 67, 68 to set the gas flow rates through the various lines and to permit fine adjustments to the pressures in the chambers. The expansion chamber 52 and the etch chamber 54 were both maintained at a temperature of 35.0° C., while different gases were placed in the first and second gas sources for the various etches.

Although not shown in the drawing, the apparatus may be varied to improve the sample uniformity and reduce the total etch time (by actively moving reaction products away from etch sites and replenishing the etch site with reactant) by placing an agitator in the etch chamber 54, by including a circulation line between the etch and expansion chambers with a pump in the line to circulate the gas mixture through the etch chamber 54 and the expansion chamber 52, or by using both of these methods.

The general procedure followed in these experiments began with the evacuation of both the expansion chamber 52 and the etch chamber 54, followed by venting both chambers to atmospheric pressure with gas from the first gas source 56 by opening the two shutoff valves 57, 55, between this gas source and the two chambers. The sample was then placed in the etch chamber 54 (with the shutoff valves 57, 55 open during the sample insertion) which was then sealed, and both the expansion chamber 52 and the etch chamber 54 were evacuated. All valves were then closed.

The connecting valve 55 between the expansion chamber 52 and the etch chamber 54 was opened, and the shutoff valve 57 at the outlet of the first gas source 56 was opened briefly to allow the gas from the first gas source to enter the expansion and etch chambers to a pressure of about 630 mbar (470 torr). The shutoff valve 57 was then closed. The connecting valve 55 was then closed, and the expansion chamber 52 was evacuated and isolated. The supply valve 53 from the xenon difluoride source chamber 51 was then opened to allow xenon difluoride gas to enter the expansion chamber to a pressure above 8 mbar (6 torr) (due to the higher temperature of the expansion chamber). The supply valve 53 was then closed, outlet valve 63 was opened, and the needle valve 67 was opened slightly to lower the xenon difluoride pressure in the expansion chamber to 6.7 mbar (5 torr). Both the outlet valve 63 and the needle valve 67 were then closed. The shutoff valve 59 at the second gas source 58 was then opened and with the assistance of the needle valve 66, gas from the second gas source was bled into the expansion chamber to a pressure of about 27 mbar (20 torr). At this point the expansion chamber 52 contained xenon difluoride at 7 mbar (5 torr) plus gas from the second gas source 18 at 20 mbar (15 torr), while the etch chamber 54 contained gas from the first gas source at 630 mbar (470 torr).

The connecting valve 55 between the expansion chamber 52 and the etch chamber 54 was then opened to allow the gas mixture from the expansion chamber to enter the etch chamber as the gases from the two chambers became mixed and distributed between the chambers, thereby beginning the etch process. The etch chamber thus contained xenon difluoride at a partial pressure of 4.7 mbar (3.5 torr) gas from the first gas source at a partial pressure of 180 mbar (140 torr) and gas from the second gas source at a partial pressure of 14 mbar (11 torr), thereby resulting in a (second gas) (first gas):(xenon difluoride) volume ratio of 3:39:1. The etch process was continued for as long as needed to remove all of the sacrificial layer, as determined visually, then discontinued.

FIG. 13 represents a different apparatus than that illustrated in FIG. 12. In FIG. 13, the etchant gas for the second etch originates in a source chamber 71. If xenon difluoride is used, effective results can be achieved by maintaining the crystals under 40 degrees C. (e.g. at a temperature of 28.5° C.). (Xenon difluoride is only one of several etchant gases that can be used. Examples of other gases are mentioned elsewhere herein.) The sublimation pressure of xenon difluoride crystals at 28.5° C. is 5–11 mbar (4–8 torr). An expansion chamber 72 receives xenon difluoride gas from the crystals in the source chamber(s) 71, and a shutoff valve 73 is positioned between the source and expansion chambers. The sample to be etched 74 is placed in an etch chamber 75, which can contain a baffle 76 and a perforated plate 77. A reciprocating pump is positioned between the expansion chamber 72 and the etch chamber 75.

Also shown are four individual gas sources 79, 90, 114 and 117 supplying the expansion chamber 72 through shutoff valves 91, 92, 116 and 119, a vacuum pump 123 and associated shutoff valves 94, 95, 96, 97, and 98 to control the evacuation of the chambers, a third gas source 99 serving as a pump ballast with an associated shutoff valve 100 to prevent backstreaming from the pump 123, and manually operated needle valves 101, 102, 103, 104, 105, 111, 115 and 118 to set the gas flow rates through the various lines and to permit fine adjustments to the pressures in the chambers. When xenon difluoride is used, the expansion chamber 72 and the etch chamber 75 are typically maintained at around room temperature (e.g. 25.0C). However, the expansion chamber and etch chamber could also be heated (e.g. to between 25 and 40 degrees C.), though this would likely be performed in conjunction with directly cooling the sample being processed. A recirculation line 106 permits gas to flow continuously through the etch chamber 75 in a circulation loop that communicates (via valves 96, 97, and 104, 105) with the expansion chamber 72 and reenters the etch chamber 75 by way of the reciprocating pump 78. Valve 112 permits gas transfer between expansion chamber 72 and etch chamber 75 via a portion of the recirculation line 106 without traversing recirculation pump 78. Valve 113 in path 110 permits introduction of etchant gas into the expansion chamber 72 to replenish the etchant mixture during the etching process.

The valves are preferably corrosive gas resistant bellows-sealed valves, preferably of aluminum or stainless steel with corrosive resistant O-rings for all seals (e.g. Kalrez™ or Chemraz™). The needle valves are also preferably corrosion resistant, and preferably all stainless steel. As an optional feature, a filter 109 can be placed in the recirculation line 106 to remove etch byproducts from the recirculation flow, thereby reducing the degree of dilution of the etchant gas in the flow. The filter can also serve to reduce the volume of effluents from the process. The etch chamber 75 can be of any shape or dimensions, but the most favorable results will be achieved when the internal dimensions and shape of the chamber are those that will promote even and steady flow with no vortices or dead volumes in the chamber interior. A preferred configuration for the etch chamber is a circular or shallow cylindrical chamber, with a process gas inlet port at the center of the top of the chamber, plus a support in the center of the chamber near the bottom for the sample, and an exit port in the bottom wall or in a side wall below the sample support. The baffle 76 is placed directly below the entry port. The perforated plate 77 is wider than the baffle 76 and preferably transmits all gas flow towards the sample.

The etching chamber of both FIGS. 12 and 13 can be provided so as to be capable of energizing one or more gases for the first etch. For example, the etching chamber can be provided with a system for creating a plasma in the etching chamber. As can be seen in FIG. 14, top and bottom electrodes are separated by a grounded diffuser plate 42 that allows gas to be transported between the upper and lower areas. When the lower electrode is powered, the system can operate like a conventional RIE, whereas when the upper electrode is powered, the plasma is confined to region 41 between the upper electrode and ground grid 42. In this mode ("remote plasma mode") the substrate or wafer 43 is shielded from ion bombardment but free radicals and neutral species can be readily transported to the substrate surface.

The first etch in the present invention can involve one or more of sputter etching, chemical etching, and accelerated ion-assisted etching (each capable of being caused by the plasma system of FIG. 14, though other ways of causing these types of etching are known). In accelerated ion-assisted etching, like the sputtering process, ions are accelerated by the sheath potential. But, unlike sputter etching, the purpose of the accelerated ions are not to sputter away the surface, but rather to damage the surface only, leaving dangling bonds and dislocations in the surface. This is to modify the surface into a more reactive form so that the damaged surface will react with the neutral etchants more easily. Sputter etching is a purely physical process whereby surface materials are being ejected by impinging ions. The ions are propelled by the sheath potentials. Thus, they acquire energy and momentum to knock off the surface materials when they hit on the surface. The pressure has to be low in order for the surface materials to move across the reactor onto opposing surfaces. This is also to prevent ejected materials from colliding with the gas molecules and thus back-scattering onto the surface. Chemical etching (during a plasma etch), on the other hand, is a spontaneous reaction between plasma-generated neutral species and substrate material to form volatile gaseous reaction products.

The apparatus for providing the physical or physical/chemical etching can be within the same chamber as for the second etch, as noted above, as part of a second apparatus separate from the apparatus for the second etch, or within a separate chamber but as part of the same apparatus as that used for the second etch. Being provided as part of the same apparatus, whether in the same chamber or not, allows for the first and second etches to take place without exposing the substrate being etched to ambient. In a preferred embodiment, the substrate being etched is not exposed to gases other than gases used in the first or second etch process. A load lock (not shown) can also be provided with the appropriate valves for evacuating the load lock chamber.

In addition to the etchant for the second etch, illustrated as chamber 71 in FIG. 13, one or more sources of additional gases, such as O2, SF6, a source of the first etchant (e.g. a hydrocarbon or fluorocarbon), N2, Ar, He, or other diluent gas sources or other sources for providing chemical or physical etching, as well as a source of stiction-reducing agent (e.g. an alkyl chlorosilane) could be connected to the etching chamber(s). These additional gas sources (potentially in liquid or solid form under pressure) are illustrated as sources 79, 90, 114 and 117 in FIG. 13. Of course additional sources of gases for introduction to the etching apparatus could be provided, and could be provided to separate chambers, depending upon whether a single or multiple chamber apparatus is used.

After releasing the micromechanical structure(s), the first wafer with such structures thereon can be packaged (e.g. if circuitry is provided on the first wafer), or the first wafer can be bonded to another wafer having circuitry thereon, in a "flip-chip" type of assembly. The bonding of the circuitry wafer to the first wafer holding the microstructures can be by anodic bonding, metal eutectic bonding, fusion bonding, epoxy bonding, or other wafer bonding processes known in the art. A preferred bonding method is bonding with an IR or UV epoxy such as disclosed in U.S. Pat. No. 5,963,289 to Stefanov et al, "Asymmetrical Scribe and Separation Method of Manufacturing Liquid Crystal Devices on Silicon Wafers", which is hereby incorporated by reference. In order to maintain separation between the bonded wafers, spacers can be mixed into the epoxy. The spacers can be in the form of spheres or rods and can be dispensed and dispersed between the first wafer and sealing wafer in order to keep the sealing wafer spaced away from the first wafer (so as to avoid damage to the microstructures on the first wafer). Spacers can be dispensed in the gasket area of the display and therefore mixed into the gasket seal material prior to seal dispensing. This is achieved through normal agitated mixing processes. The final target for the gap between the first wafer and sealing wafer can be from 1 to 100 um. This of course depends upon the type of MEMS structure being encapsulated and whether it was surface or bulk micromachined (bulk micromachined structures may not need any spacers between the two wafers). The spheres or rods can be made of glass or plastic, preferably an elastically deforming material. Alternatively, spacer pillars can be microfabricated on at least one of the wafer substrates. In one embodiment, pillars/spacers are provided only at the edge of the array. In another embodiment, pillars/spacers can be fabricated in the array itself. If the spacers are micro-fabricated spacers, they can be formed on the lower wafer, followed by the dispensing of an epoxy, polymer, or other adhesive (e.g. a multi-part epoxy, or a heat or UV-cured adhesive) adjacent to the micro-fabricated spacers. The adhesive and spacers need not be co-located, but could be deposited in different areas on the lower substrate wafer. Alternative to glue, a compression bond material could be used that would allow for adhesion of the upper and lower wafers. Spacers micro-fabricated on the lower wafer (or the upper wafer) and could be made of polyimide, SU-8 photo-resist.

Then, the two wafers are aligned. If precision alignment is desired, alignment of the opposing electrodes or active viewing areas may involve registration of substrate fiducials on opposite substrates. This task accomplished with the aid of video cameras with lens magnification. The machines range in complexity from manual to fully automated with pattern recognition capability. Whatever the level of sophistication, they accomplish the following process: 1. Dispense a very small amount of a UV curable adhesive at locations near the perimeter and off of all functional devices in the array; 2. Align the fiducials of the opposing substrates within the equipment capability; and 3. Press substrates and UV tack for fixing the wafer to wafer alignment through the remaining bonding process (e.g., curing of the internal epoxy).

The final cell gap can be set by pressing the previously tacked laminates in a UV or thermal press. In a UV press, a common procedure would have the substrates loaded into a press where at least one or both of the press platens are quartz, in order to allow UV radiation from a UV lamp to pass unabated to the gasket seal epoxy. Exposure time and flux rates are process parameters determined by the equipment and adhesive materials. Thermally cured epoxies may require that the top and bottom platens of a thermal press be heated. The force that can be generated between the press platens is typically many pounds. With thermally cured epoxies, after the initial press the arrays are typically transferred to a stacked press fixture where they can continue to be pressed and post-cured. In one embodiment, the epoxy between the first wafer and sealing wafer is only partially cured so as to allow easier removal of the sealing wafer. After the sealing wafer is removed, this epoxy can be optionally cured. An epoxy can be selected that adheres less well (depending upon the wafer materials) than other epoxies, so as to allow for easier removal of the sealing wafer after singulation. Also, UV epoxy and IR epoxy can be used at the same time, with the UV epoxy being cured prior to IR cure.

Once the wafers have been bonded together to form a wafer assembly, the assembly can be separated into individual dies. Scribes are placed on the respective substrates in an offset relationship at least along one direction. The units are then separated, resulting in each unit having a ledge on each end of the die. Such a ledge can also allow for electrical testing of each die, as electrical contacts can be exposed on the ledge (e.g., if circuitry has been formed together with the microstructures on the first wafer). The parts can then be separated from the array by venting the scribes on both substrates. Automatic breaking can be done by commercially available guillotine or fulcrum breaking machines. The parts can also be separated by hand.

Separation may also by done by glass scribing and partial sawing of one or both substrates. Sawing is preferably done in the presence of a high-pressure jet of water. Moisture must not be allowed to contact the microstructures. Therefore, at gasket dispense, an additional gasket bead must be dispensed around the perimeter of the wafer, or each gasket bead around each die must fully enclose the die area so that water can not enter and touch the microstructures. Preferably, however, the end of each scribe/saw lane must be initially left open, to let air vent during the align and press processes. After the array has been pressed and the gasket material fully or partially cured, the vents are then closed using either the gasket or end-seal material. The glass is then scribed and sawed.

Alternatively, both the first wafer and sealing wafer substrates may be partially sawed prior to part separation. With the same gasket seal configuration, vent and seal processes as described above, saw lanes are aligned to fiducials on the sealing substrate. The glass is sawed to a depth between 25% and 95% of its thickness. The first wafer substrate is sawed and the parts separated as described above.

The first wafer, upon which the micromechanical structures are formed and released, can be any suitable substrate for the particular MEMS microstructure (and optionally circuitry) formed thereon, such as a light transmissive substrate such as glass, borosilicate, tempered glass, quartz or sapphire, or any other suitable light transmissive material. Or, the first wafer could be a metal, ceramic or preferably a semiconductor wafer (e.g. silicon or GaAs). An anti-reflective coating can be applied to the glass either before processing begins on the glass, or preferably at the time of packaging.

There are many variations possible to the preferred embodiments disclosed above. For example, the second etch, instead of using the previously-mentioned gas phase fluoride non-plasma etchants, could instead use a gas phase acid, such as (non-plasma) HF, HBr, Hl, Cl2, combinations thereof (and any such acid(s) with or without H2), non-energized except for being at a high temperature (e.g. 900C or above). Or, either the first or second etch could include Bl3, BBr3, BCl3 or AlCl3 (plasma etch for the first etch or non-plasma chemical etch for the second). As with any of the etchants, the etch can be performed in pulse or continuous mode.

It should be noted that the invention is applicable to forming micromirrors such as for a projection display or optical switch, or any other MEMS device that would benefit from protection of the microstructures during wafer singulation. If an optical switch is the microstructure being protected, mirrors with multiple hinges can be provided on the first wafer so as to allow for multi-axis movement of the mirror. Such multi-axis movement, mirrors for achieving such movement, and methods for making such mirrors are disclosed in U.S. patent application Ser. No. 09/617,149 to Huibers et al. filed Jul. 17, 2000, the subject matter of which is incorporated herein by reference.

Of course, the microstructure need not be a movable mirror (for a projection display, for optical switching, or even for data storage), but could be one or more accelerometers, DC relay or RF switches, microlenses, beam splitters, filters, oscillators and antenna system components, variable capacitors and inductors, switched banks of filters, resonant comb-drives and resonant beams, etc. Any MEMS structure, particularly a released or movable structure, could benefit from the release method described herein.

The invention has been described in terms of specific embodiments. Nevertheless, persons familiar with the field will appreciate that many variations exist in light of the embodiments described herein.

We claim:

1. A method for releasing a micromechanical structure, comprising:

providing a substrate;

providing a sacrificial material directly or indirectly on the substrate;

providing one or more micromechanical structural layers on the sacrificial material;

performing a first etch to remove a portion of the sacrificial material, the first etch comprising providing an etchant and energizing the etchant so as to allow the etchant to physically, or chemically and physically, remove the portion of the sacrificial material;

after performing said first etch performing a second etch to remove additional sacrificial material, the second etch comprising providing an etchant that chemically but not physically etches the additional sacrificial material.

2. The method of claim 1, wherein the etchant of the first etch is a fluorocarbon or a hydrocarbon.

3. The method of claim 1, wherein the etchant of the second etch is a noble gas halide or interhalogen gas that spontaneously etches the sacrificial material.

4. The method of claim 3, wherein the sacrificial material comprises silicon or a silicon compound.

5. The method of claim 2, wherein the etchant of the first etch is an iodofluorocarbon.

6. The method of claim 1, wherein the etchant of the first etch comprises a fluorocarbon and one or more of: O2, an inert gas, N2, F2, H2, CO, SF6, NF3, SiF4 or an additional fluorocarbon.

7. The method of claim 6, wherein the inert gas is Xe or Ar gas.

8. The method of claim 3, wherein the noble gas halide is xenon difluoride.

9. The method of claim 3, wherein the interhalogen is IF5, BrCl3, BrF3, IF7 or ClF3.

10. The method of claim 4, wherein the sacrificial material comprises amorphous silicon, polycrystalline silicon or silicon dioxide.

11. The method of claim 10, wherein the one or more micromechanical structural layers comprise at least one silicon nitride layer.

12. The method of claim 1, wherein the etchant of the first etch is an unsaturated fluorocarbon.

13. The method of claim 12, wherein the unsaturated fluorocarbon is one or more of octafluoro-2-butene, hexafluorocyclobutene, hexafluoro-1,3-butadiene, hexafluoro-2-butyne, hexafluoropropene and octafluorocyclopentene.

14. The method of claim 1, wherein the second etch is a non-plasma gas phase fluoride etch.

15. The method of claim 14, wherein the first etch removes from 5 to 225 angstroms of sacrificial material, and the second etch removes the remaining sacrificial material.

16. The method of claim 1, wherein the providing of the one or more micromechanical structural layers comprises providing at least one layer comprising a metal or metal compound layer.

17. The method of claim 16, wherein the metal or metal compound comprises aluminum.

18. The method of claim 17, wherein the aluminum is deposited by sputtering.

19. The method of claim 18, wherein the providing of the one or more micromechanical structural layers further comprises providing at least one layer comprising silicon or a silicon compound.

20. The method of claim 19, wherein the silicon or silicon compound is polysilicon, silicon dioxide or silicon nitride or silicon oxynitride.

21. The method of claim 20, wherein the silicon or silicon compound is Si3N4.

22. The method of claim 19, wherein the at least one layer comprising silicon or a silicon compound is provided by sputtering or chemical vapor deposition.

23. The method of claim 1, wherein the etchant of the first etch comprises CH4 or C4H8, and the etchant of the second etch comprises XeF2, IF5, IF7 or BrF3.

24. The method of claim 1, wherein the etchant of the first etch is ionized and the etchant of the second etch is not.

25. The method of claim 1, wherein the etchant of the first etch comprises an oxygenated perfluorocarbon.

26. The method of claim 1, wherein the first and/or second etch is performed maskless.

27. The method of claim 26, wherein both the first and second etches are performed maskless.

28. The method of claim 1, wherein the etchant of the second etch comprises a gas phase fluoride etchant.

29. The method of claim 1, wherein both the etchant of the first etch and the etchant of the second etch are compounds that comprise fluorine.

30. The method of claim 1, wherein the first etch is a physical etch.

31. The method of claim 30, wherein the physical etch is a sputter etch.

32. The method of claim 31, wherein the sputter etch is an Ar sputter etch.

33. The method of claim 1, wherein the first etch comprises a plurality of sputter etching, chemical etching and accelerated ion-assisted etching.

34. The method of claim 1, further comprising providing MOS-type circuitry on the wafer substrate prior to depositing the sacrificial material.

35. The method of claim 1, further comprising providing a second wafer substrate with MOS-type circuitry thereon, and bonding the wafer substrate and the second wafer substrate together.

36. The method of claim 1, wherein the providing of the sacrificial material comprises depositing the sacrificial material by spin-on, chemical vapor deposition or sputtering, followed by patterning.

37. The method of claim 1, wherein the providing of the one or more micromechanical structural layers comprises depositing the one or more layers by chemical vapor deposition and/or sputtering, followed by patterning to form the desired shape of micromechanical structure.

38. The method of claim 1, wherein the first etch uses two or more of CF4, SF6, O2 and Ar.

39. The method of claim 1, wherein the first etch comprises a CF4 plasma and/or Ar sputter, and the second etch comprises xenon difluoride.

40. The method of claim 39, wherein the first etch further comprises O2 and/or SF6 and the second etch further comprises at least one of He, Ne, Ar, Kr, Xe or N2.

41. The method of claim 1, wherein the etchant of the first etch has a selectivity towards the sacrificial material over the micromechanical structural materials of 200:1 or less, and the etchant of the second etch has a selectivity towards the sacrificial material over the micromechanical structural materials of more than 200:1.

42. The method of claim 41, wherein the etchant of the first etch has a selectivity of 100:1 or less.

43. The method of claim 42, wherein the etchant of the second etch has a selectivity of 500:1 or more.

44. The method of claim 43, wherein the etchant of the first etch has a selectivity of 35:1 or less and the etchant of the second etch has a selectivity of 1000:1 or more.

45. The method of claim 1, wherein the first and second etches are performed in situ.

46. The method of claim 45, wherein from the beginning of the first etch to the end of the second etch, the substrate is not exposed to gases other than gases used in the first or second etch processes.

47. The method of claim 1, wherein the substrate is not exposed to ambient air between the first and second etch.

48. The method of claim 1, wherein the first etch is performed in a first chamber different from a second chamber for performing the second etch, the first and second chambers being connected together.

49. The method of claim 1, wherein the micromechanical structure is a micromirror for an optical switch or projection display.

50. The method of claim 47, further comprising depositing an anti-stiction material on the micromechanical structures.

51. A method for etching a silicon material on or within a substrate, comprising:
performing a first etch to remove a portion of the silicon material, the first etch comprising providing an etchant and energizing the etchant so as to allow the etchant to physically, or chemically and physically, remove the portion of the material;
after performing said first etch performing a second etch to remove additional silicon material, the second etch comprising providing an etchant that chemically but not physically etches the additional silicon material.

52. The method of claim 51, wherein the etchant of the first etch is a fluorocarbon or a hydrocarbon.

53. The method of claim 51, wherein the etchant gas of the second etch is a noble gas halide or interhalogen gas that spontaneously etches the material.

54. The method of claim 53, wherein the material has at least one deposited layer thereon prior to etching.

55. The method of claim 52, wherein the etchant of the first etch is an iodofluorocarbon.

56. The method of claim 51, wherein the first etch comprises a fluorocarbon and one or more of: O2, an inert gas, N2, F2, H2, CO, SF6, NF3, SiF4 or an additional fluorocarbon.

57. The method of claim 56, wherein the inert gas is Xe or Ar gas.

58. The method of claim 53, wherein the noble gas halide is xenon difluoride.

59. The method of claim 53, wherein the interhalogen is IF5, BrCl3, BrF3, IF7 or ClF3.

60. The method of claim 54, wherein the material comprises amorphous silicon, polycrystalline silicon and/or single crystal silicon.

61. The method of claim 54, wherein the at least one deposited layer on the material is a micromechanical or IC structural layer.

62. The method of claim 51, wherein the etchant of the first etch is an unsaturated fluorocarbon.

63. The method of claim 62, wherein the unsaturated fluorocarbon is one or more of octafluoro-2-butene, hexafluorocyclobutene, hexafluoro-1,3-butadiene, hexafluoro-2-butyne, hexafluoropropene and octafluorocyclopentene.

64. The method of claim 51, wherein the second etch is a non-plasma gas phase fluoride etch.

65. The method of claim 64, wherein the first etch removes from 5 to 225 angstroms of silicon, and the second etch removes the at least an additional 5 to 225 angstroms of silicon.

66. The method of claim 54, wherein the at least one deposited layer on the material includes at least one metal layer or metal compound layer.

67. The method of claim 66, wherein the metal or metal compound comprises aluminum.

68. The method of claim 67, wherein the aluminum is deposited by sputtering.

69. The method of claim 54, wherein the at least one deposited layer comprises at least one layer comprising silicon or a silicon compound.

70. The method of claim 69, wherein the silicon or silicon compound is polysilicon, silicon dioxide or silicon nitride or silicon oxynitride.

71. The method of claim 70, wherein the silicon or silicon compound is Si3N4.

72. The method of claim 69, wherein the at least one layer comprising silicon or a silicon compound a sputtered or CVD silicon or silicon compound.

73. The method of claim 51, wherein the etchant of the first etch comprises CH4 or C4H8, and the etchant of the second etch comprises XeF2, IF5, IF7 or BrF3.

74. The method of claim 51, wherein the etchant gas of the first etch is ionized and the etchant gas of the second etch is not.

75. The method of claim 51, wherein the etchant gas of the first etch comprises an oxygenated perfluorocarbon.

76. The method of claim 51, wherein the first and/or second etch is performed maskless.

77. The method of claim 76, wherein both the first and second etches are performed maskless.

78. The method of claim 51, wherein the etchant of the second etch comprises a gas phase fluoride etchant.

79. The method of claim 51, wherein both the etchant of the first etch and the etchant of the second etch are compounds that comprise fluorine.

80. The method of claim 51, wherein the first etch is a physical etch.

81. The method of claim 80, wherein the physical etch is a sputter etch.

82. The method of claim 81, wherein the sputter etch is an Ar sputter etch.

83. The method of claim 51, wherein the first etch comprises a plurality of sputter etching, chemical etching and accelerated ion-assisted etching.

84. The method of claim 51, wherein the substrate comprises MOS-type circuitry.

85. The method of claim 51, further comprising providing a second substrate with MOS-type circuitry thereon, and bonding the second substrate and the etched substrate together.

86. The method of claim 51, wherein the material is single crystal silicon within a silicon wafer or wafer portion, or is silicon deposited on a wafer or wafer portion by chemical vapor deposition or sputtering.

87. The method of claim 54, wherein the at least one additional layer on the material is one or more micromechanical structural layers deposited by chemical vapor deposition and/or sputtering, followed by patterning to form the desired shape of micromechanical structure.

88. The method of claim 51, wherein the first etch uses two or more of CF4, SF6, O2 and Ar.

89. The method of claim 51, wherein the first etch comprises a CF4 plasma and/or Ar sputter, and the second etch comprises xenon difluoride.

90. The method of claim 89, wherein the first etch further comprises O2 and/or SF6 and the second etch further comprises at least one of He, Ne, Ar, Kr, Xe or N2.

91. The method of claim 54, wherein the etchant of the first etch has a selectivity towards the silicon over the at least one layer thereon of 200:1 or less, and the etchant of the second etch has a selectivity towards the silicon over the at least one layer thereon of more than 200:1.

92. The method of claim 91, wherein the etchant of the first etch has a selectivity of 100:1 or less.

93. The method of claim 92, wherein the etchant of the second etch has a selectivity of 500:1 or more.

94. The method of claim 93, wherein the etchant of the first etch has a selectivity of 35:1 or less and the etchant of the second etch has a selectivity of 1000:1 or more.

95. The method of claim 51, wherein the first and second etches are performed in situ.

96. The method of claim 95, wherein from the beginning of the first etch to the end of the second etch, the substrate is not exposed to gases other than gases used in the first or second etch processes.

97. The method of claim 51, wherein the substrate is not exposed to ambient air between the first and second etch.

98. The method of claim 51, wherein the first etch is performed in a first chamber different from a second chamber for performing the second etch, the first and second chambers being connected together.

99. The method of claim 51, wherein the etchant of the first etch is ionized and the etchant of the second etch is not.

100. The method of claim 97, further comprising depositing an anti-stiction material on the at least one deposited layer after removal of the silicon by the first and second etches.

* * * * *